(12) United States Patent
Harter et al.

(10) Patent No.: US 8,773,754 B2
(45) Date of Patent: Jul. 8, 2014

(54) UTILIZATION OF YB: AND ND: MODE-LOCKED OSCILLATORS IN SOLID-STATE SHORT PULSE LASER SYSTEMS

(75) Inventors: Donald J. Harter, Ann Arbor, MI (US); Gyu C. Cho, Ann Arbor, MI (US); Martin E. Fermann, Dexter, MI (US); Ingmar Hartl, Hamburg (DE)

(73) Assignee: IMRA America, Inc., Ann Arbor, MI (US)

( * ) Notice: Subject to any disclaimer, the term of this patent is extended or adjusted under 35 U.S.C. 154(b) by 426 days.

(21) Appl. No.: 13/053,600

(22) Filed: Mar. 22, 2011

(65) Prior Publication Data

US 2011/0200061 A1    Aug. 18, 2011

Related U.S. Application Data

(60) Continuation of application No. 12/132,364, filed on Jun. 3, 2008, now Pat. No. 7,929,203, which is a division of application No. 10/960,923, filed on Oct. 12, 2004, now Pat. No. 7,394,591, which is a continuation-in-part of application No. 09/576,772, filed on May 23, 2000, now Pat. No. 6,885,683.

(51) Int. Cl.
*H04B 10/17* (2006.01)
*H01S 3/10* (2006.01)
*H01S 5/50* (2006.01)
*H01S 3/23* (2006.01)

(52) U.S. Cl.
CPC ............... *H01S 5/5045* (2013.01); *H01S 3/235* (2013.01); *H01S 3/10023* (2013.01)
USPC ................................ 359/337.2; 359/341.1

(58) Field of Classification Search
USPC ...................... 359/337.2, 341.1, 348; 372/25
See application file for complete search history.

(56) References Cited

U.S. PATENT DOCUMENTS

| 4,829,529 A | 5/1989 | Kafka |
| 5,163,059 A | 11/1992 | Negus |
| 5,329,398 A | 7/1994 | Lai |

(Continued)

FOREIGN PATENT DOCUMENTS

| EP | 1281378 A1 | 2/2003 |
| JP | 1073851 A | 3/1998 |

(Continued)

OTHER PUBLICATIONS

"Short Pulse Generation in Ti: doped materials", D. Harter, et al, published at CLEO 1988 PD6-7.

(Continued)

*Primary Examiner* — Eric Bolda
(74) *Attorney, Agent, or Firm* — Sughrue Mion, PLLC

(57) ABSTRACT

An optimized Yb: doped fiber mode-locked oscillator and fiber amplifier system for seeding Nd: or Yb: doped regenerative amplifiers. The pulses are generated in the Yb: or Nd: doped fiber mode-locked oscillator, and may undergo spectral narrowing or broadening, wavelength converting, temporal pulse compression or stretching, pulse attenuation and/or lowering the repetition rate of the pulse train. The conditioned pulses are subsequently coupled into an Yb: or Nd: fiber amplifier. The amplified pulses are stretched before amplification in the regenerative amplifier that is based on an Nd: or Yb: doped solid-state laser material, and then recompressed for output.

10 Claims, 10 Drawing Sheets

(56) References Cited

U.S. PATENT DOCUMENTS

| | | |
|---|---|---|
| 5,390,202 A | 2/1995 | Yan et al. |
| 5,513,194 A | 4/1996 | Tamura |
| 5,530,582 A | 6/1996 | Clark |
| 5,572,358 A | 11/1996 | Gabl et al. |
| 5,592,327 A | 1/1997 | Gabl et al. |
| 5,745,284 A | 4/1998 | Goldberg et al. |
| 5,847,863 A | 12/1998 | Galvanauskas |
| 5,862,845 A | 1/1999 | Chin et al. |
| 5,880,877 A | 3/1999 | Fermann |
| 6,049,554 A | 4/2000 | Lang et al. |
| 6,150,630 A | 11/2000 | Perry et al. |
| 6,151,338 A | 11/2000 | Grubb |
| 6,181,463 B1 | 1/2001 | Galvanauskas |
| 6,188,705 B1 | 2/2001 | Krainak et al. |
| 6,236,779 B1 | 5/2001 | Kafka |
| 6,243,522 B1 | 6/2001 | Allan |
| 6,389,198 B2 | 5/2002 | Kafka et al. |
| 6,697,393 B2 | 2/2004 | Kasamatsu et al. |
| 6,751,240 B2 | 6/2004 | Arisawa et al. |
| 6,760,356 B2 | 7/2004 | Erbert et al. |
| 7,804,864 B2 | 9/2010 | Gu |
| 2001/0048788 A1 | 12/2001 | Xie |
| 2003/0118060 A1 | 6/2003 | Spuehler et al. |
| 2003/0156605 A1 | 8/2003 | Richardson |
| 2003/0189959 A1 | 10/2003 | Erbert et al. |
| 2004/0036957 A1 | 2/2004 | Galvanauskas |
| 2004/0240037 A1 | 12/2004 | Harter et al. |
| 2005/0226286 A1 | 10/2005 | Liu |
| 2006/0050369 A1* | 3/2006 | Kafka et al. .................. 359/348 |
| 2006/0159137 A1 | 7/2006 | Shah |
| 2010/0272129 A1 | 10/2010 | Harter |

FOREIGN PATENT DOCUMENTS

| | | |
|---|---|---|
| JP | 2001-353176 A | 12/2001 |
| JP | 10213827 A | 6/2006 |
| WO | WO 2002/084821 A3 | 10/2002 |
| WO | WO 2004/057412 A2 | 7/2004 |
| WO | WO 2004/068651 A2 | 8/2004 |

OTHER PUBLICATIONS

"High-power Amplification of Femtosecond Optical Pulses in a Diode-Pumped Fiber System", A. Galvanauskas, et al, Optics Letters, vol. 19, No. 16, Aug. 15, 1994, pp. 1201-1203.
"Alexandrite-pumped Alexandrite Regenerative Amplifier for Femtosecond Pulse Amplification", A. Hariharan et al, Optics Letters, vol. 21, No. 2, Jan. 15, 1996, pp. 128-130.
"Injection of Ultrafast Regenerative Amplifiers with Low Energy Femtosecond Pulses from an Er-doped Fiber Laser", A. Hariharan et al. Optics Communication, Dec. 15, 1996, pp. 469-473.
"Wavelength Tunable Alexandrite Regenerative Amplifier", D. Harter, et al, Applied Optics, vol. 27, No. 21 Nov. 1, 1988, pp. 4392-4395.
"Tooth Ablation Using a CPA-free Thin Disk Femtosecond Laser System", M.H. Niemz, et al, Applied Physics B (Lasers and Optics) 79, 269-271 Aug. 2004.
"Diode-pumped Thin-disk Yb: YAG Regenerative Amplifier", C. Honninger et al, Applied Physics B (Lasers and Optics) 65, 423-426 (1997).
"Ultrafast ytterbium-doped Bulk Lasers and Laser Amplifiers", C. Nonninger et al, Applied Physics B (Lasers and Optics) 69, 3-17 (1999).
"Ensuring Compactness, Reliability, and Scalability for the Next Generation of High-Field Lasers", John Nees, et al, IEEE Journal, Quantum Electronics, vol. 4, No. 2, Mar./Apr. 1998, pp. 376-384.
Picosecond SESAM-Based Ytterbium Mode-Locked Fiber Lasers, L. Gomes, et al, IEEE Journal, Quantum Electronics, vol. 10, No. 1, Jan./Feb. 2004.
"Corneal Refractive Surgery with Femtosecond Lasers", T. Juhasz, et al, IEEE Journal, Quantum Electronics, vol. 5, No. 4, Jul./Aug. 1999.

Yb:KGd($WO_4$)$_2$ Chirped-pulse renegerative Amplifiers, H. Liu et al, Optics Communication 203, Mar. 15, 2002 pp. 315-321.
"Chirped-pulse Amplification of 1-fsec Pulses", M. Pessot et al, Optics Letters, Aug. 1, 1989 vol. 14, No. 15, pp. 797-799.
"Mode-locking with Cross-phase and Self-phase Modulation", M. Hofer et al, Optics Letters, vol. 16, No. 7, Apr. 1, 1991, pp. 502-504.
"100-fs Pulse Generation and Amplification in Ti" $Al_2O_3$, Jeff Squier, Optics Letters, vol. 16, No. 5, Mar. 1, 1991, pp. 324-326.
"Regenerative Nd:glass Amplifier Seeded with a Nd:fiber Laser", M. Hofer et al, Optics Letters, vol. 17, No. 11, Jun. 1, 1992 pp. 807-809.
"Femtosecond Pulse Amplification at 250 kHz with a Ti:sapphire Rengenerative Amplifier and Application to Continuum Generation", Optics Letters, vol. 17, No. 14, Jul. 15, 1992, pp. 1009-1011.
"Compact Directly Diode-Pumped Femtosecond Nd:glass Chirped-pulse-Amplification Laser System", Optics Letters, vol. 22, No. 23, Dec. 1, 1997, pp. 1790-1792.
"Directly Diode-pumped Millijoule Subpicosecond Yb:glass Regenerative Amplifier", Optics Letters, vol. 24, No. 13, Jul. 1, 1999, pp. 917-919.
PicoREGEN High Q Laser, May 2004.
"LaserForefront", Spectra-Physics, No. 37 (2004).
"Ytterbium Tungstate Revolutionizes the Field of High-Power Ultrafast Lasers", Photonics Spectra, Mar. 2004.
"Yb:KGW yield simpler, more versatile femtosecond systems", OE Magaznine, May 2004.
"Time-tailored Laser pulses: a new approach for laser micromachining and microfabrication processing", M. Stock et al, SPIE Photonics West (2003), San Jose and SPIE Publication #4984-28.
"Ultrashort laser pulses tackle precision machining", Xinbing Liu et al, Aug. 1997.
"Compression of Amplified Chirped Optical Pulses", D. Strickland et al, vol. 56, No. 3, Dec. 1, 1985, pp. 219-221.
Ytterbium-doped glass regenerative chirped-pulse amplifier, Subrat Biswal et al, Optics Communications 160, Feb. 1999, pp. 92-97.
"A Spatially Dispersive Regenrative Amplifier for Ultrabroadband Pulses", Jerome Faure et al, Optics Communications 159, Jan. 1, 1999, pp. 68-73.
"Efficient Energy Extraction Below the Saturation Fluence in a Low-Gain Low-Loss Regenratie Chirped-Pulse Amplifier", IEEE Journal, Quantum Electronics vol. 4, No. 2, Mar./Apr. 1998.
"Diode-pumped Nd:glass kilohertz regenerative amplifier for subpicosecond microjoule level pulses", Alan Braun et al, Applied Optics. vol. 36, No. 18, Jun. 20, 1997.
"Ultrahigh-intensity lasers: Physics of the extreme on a tabletop"; GA Mourou, et al; Physics Today 51 (1): Jan. 22-28, 1998.
"The industrial challenge for ultrafast lasers" Liu XB, G Mourou; Laser Focus World 33 (8): 102-103 Aug. 1997.
"The ultrahigh-peak-power laser: Present and future": G. Mourou; Applied Physics B-Lasers and Optics 65 (2): 205-211 Aug. 1997.
"Terawatt to Petawatt Subpicosecond Lasers"; Perry MD, G Mourou; Science 264 (5161): 917-924 May 13, 1994.
"All-fiber source of 100 nJ subpicosecond pulses", M.E. Fermann, et al, Appl. Phys. Lett 64, Mar. 14, 1994, pp. 1315-1317.
Galvanauskas, U.S. Appl. No. 09/317,221, filed May 24, 1999.
*Ex Parte Clark-MXR Inc.*, B.P.A.I. decision, Reexamination control No. US90/005,220 of US5530582.
"First clinical results with the femtosecond neodynium-glass laser in refractive surgery"; Ratkay-Traub I, Ferincz IE, Juhasz T, Kurtz RM, Krueger RR: Journal of Refractive Surgery 19 (2): 94-103 Mar.-Apr. 2003.
"Femtosecond laser flap creation for laser in situ keratomileusis: Six-month follow-up of initial US clinical series"; Nordan LT, Slade SG, Baker RN, Suarez C, Juhasz T, Kurtz R; Journal of Refractive Surgery 19 (1): Jan.-Feb. 8-14, 2003.
Bado et al., Regenerative Amplification in Alexandrite of pulse from Specialized Oscillators, IEEE J of Quantum Electronics vol. 24, No. 6, p. 1167 Jun. 1988.
Botez et al., The Next Generation of High-Power Semiconductor Diode Lasers, TRW Space and Defense Quest, (Abstract only) pp. 21-31, Winter 1991/1992.
Duling III et al., Compact fiber soliton lasers produce ultrashort pulses, Laser Focus World Apr. 1993 p. 213.

(56) References Cited

OTHER PUBLICATIONS

Fermann et al., Environmentally stable Keer-type Mode-locked erbium Fiber Laser Producing306-fs pulses, ME Fermann, Optics Letters Jan 1, 1994, pp. 43-45 Optics Letters vol. 19, No. 1 OSA.
Harter et al., Short pulse amplification in tunable solid state materials, Harter, et al., SPIE, vol. 1229, 1990, pp. 19-28.
Mizoguchi et al., 100-fs, 10-Hz, terawatt KrF laser, M. Mizoguchi, K. Kondo, and S. Watanabe, JOSA B, vol. 9, Iss. 4, pp. 560-564 (1992).
Nabekawa et al., Terawatt KrF/Ti:sapphire hybrid laser system, Optics Letters vol. 18, No. 22, pp. 1922-1924, Nov. 15, 1993.
Saleh et al., "Acousto-optic Devices, from Fundamentals of Photonics", Wiley-Interscience publications. 1944, p. 823-825.
S. F. Su et al., "Gain equalization in multiwavelength lightwave systems using acousto-optic tunable filters", IEEE Photon. Technol. Lett. 4, 269 (1992).
Tamura et al., Technique for obtaining high-energy ultrashort pulses from an additive-pulse mode-locked erbium-doped fiber ring laser, K.Tamura, C.Doerr, L.Nelson, H.Haus, E.Ippen, Optics Letters vol. 19 Is.1 p. 46 (1994).
Yakymyshyn et al., Frequency-doubled, additive-pulse, mode-locked NaCI:OH laser, Optics Letters vol. 14, No. 15, p. 793 Aug. 1, 1989.
D. J. Harter, et al., "Alexandrite-pumped alexandrite regenerative amplifier seeded by a frequency-doubled erbium-doped fiber laser," CLEO '95, pp. 346-347, May 25, 1995.
First Office Action and claims of JP2010-209309, dated Jul. 6, 2011.
Response to First Office Action of JP2010-209309, dated Jan. 6, 2012.
Second Office Action of JP2010-209309, dated Nov. 6, 2012.
First Office Action JP2010-209309 Jul. 6, 2011 (Japanese).
Second Office Action JP2010-209309 Nov. 6, 2012 (Japanese).
FemtoRegen™ High Q Laser, May 2004.
FemtoMaster1060, brochure from Fianium (date unknown).

\* cited by examiner

UTILIZATION OF YB: AND ND: MODE-LOCKED OSCILLATORS IN SOLID-STATE SHORT PULSE LASER SYSTEMS

CROSS-REFERENCES TO RELATED APPLICATIONS

This is a Continuation of application Ser. No. 12/132,364 which is a Divisional of U.S. application Ser. No. 10/960,923 filed Oct. 12, 2004, which is a Continuation-In-Part of U.S. application Ser. No. 09/576,772 filed May 23, 2000 which issued as U.S. Pat. No. 6,885,683 on Apr. 26, 2005, the disclosure of which is incorporated by reference in its entirety.

TECHNICAL FIELD OF THE INVENTION

The object of this invention is to optimize an Yb: or Nd: doped fiber mode-locked oscillator and fiber amplifier system for seeding a relatively new class of Nd: or Yb: doped regenerative amplifiers. These systems are seeing a significant interest since they are more suitable for industrial applications. An optimized Yb: doped fiber mode-locked oscillator and fiber amplifier for seeding these regenerative amplifiers can improve the robustness and practicality of such systems for industrial applications.

BACKGROUND OF THE INVENTION

Regenerative amplifiers utilizing chirped pulse amplification (CPA) have been the dominant means for obtaining higher pulse energies with picosecond and femtosecond pulse duration. The CPA regenerative amplifier was first demonstrated for picosecond amplification in Nd:glass in by Gerard Mourou and Donna Strickland, *Compression of Amplified Chirped Optical Pulses*, Optics Communications 56 (3): 219-221, Dec. 1, 1995.

The development of broad band solid state lasers as regenerative amplifiers was first demonstrated by D. Harter and P. Bado, *Wavelength Tunable Alexandrite Regenerative Amplifier*, Applied Optics 27 (21): 4392-4395, Nov. 1, 1988 and by D. Harter, O. Montoya, J. Squier and W. Rapoport, *Short Pulse Generation in Ti: doped materials*, CLEO 1988 PD6. These systems were utilized for femtosecond amplification and were reported by M. Pessot, J. Squier, G. Mourou and D. Harter, *Chirped-Pulse Amplification of 100-Fsec Pulses*, Optics Letters 14 (15): 797-799, Aug. 1, 1989 and by J. Squier, F. Salin, G. Mourou and D. Harter, *100-FS Pulse Generation and Amplification in Ti—Al2O3*, Optics Letters 16 (5): 324-326, Mar. 1, 1991.

It is the Ti:sapphire regenerative amplifier that has been the dominant method for obtaining femtosecond pulses in the microjoule to millijoule range. These systems have been made more practical by using modelocked fiber lasers as the source of the short pulses, as first reported by A. Hariharan, M. E. Fermann, M. L. Stock, D. Harter and J. Squier, *Alexandrite-pumped Alexandrite Regenerative Amplifier for Femtosecond Pulse Amplification*, Optics Letters 21 (2): 128-130, Jan. 15, 1996 and later patented by Clark in U.S. Pat. No. 5,530,582 "Fiber source for seeding an Ultrashort optical pulse amplifier." This seeding has been studied in a number of Ti:sapphire regenerative amplifiers, as reported by A. Hariharan, D. Harter, T. S. Sosnowski, S. Kane, D. T. Du, T. B. Norris and J. Squier, *Injection of Ultrafast Regenerative Amplifiers with Low Energy Femtosecond Pulses from an Er-Doped Fiber Laser*, Optics Communications 132 (5-6): 469-473, Dec. 15, 1996.

Alternative sources for microjoule level femtosecond pulses are emerging by all fiber designs as first described by M. E. Fermann, A. Galvanauskas and D. Harter, *All-Fiber Source Of 100 nJ Subpicosecond Pulses*, Appl. Phys. Letters Vol. 64, 11, 1994, pp. 1315-1317. During the past decade, there has been intensive work in making such systems practical. The recent results were reported by M. Stock, H. Endert and R. Patel, *Time-Tailored Laser Pulses: a New Approach for Laser Micromachining and Microfabrication Processing*, SPIE Photonics West 2003, San Jose and SPIE Publication #4984-28. Such systems should be useful for lower energy applications such as LASIK as reported by T. Juhasz, H. Frieder, R. M. Kurtz, C. Horvath, J. F. Bille and G. Mourou, *Corneal Refractive Surgery with Femtosecond Lasers*, IEEE Journal Of Selected Topics In Quantum Electronics 5 (4): 902-910, July-August 1999.

However, for higher pulse energies, the regenerative amplifiers will continue to dominate because of practical uses such as micromachining as described by Xinbing Liu and Gerard Mourou, *Ultrashort Laser Pulses Tackle Precision Machining*, Laser Focus World, August 1997, Vol. 33, Issue 8, page 101.

For the micromachining applications, more industrially compatible regenerative amplifiers are being developed. These systems are based on Nd: or Yb: doped materials, rather than the Ti:sapphire that has dominated the scientific market. There are two basic reasons for this change. Commercial markets typically do not require the shorter pulses that can only be obtained from the Ti:sapphire regenerative amplifier and the Nd: and Yb: based materials can be directly diode pumped, which makes these systems more robust and less expensive. An unresolved technical issue for Nd: or Yb: based regenerative amplifiers is the need for an equally robust seed source for the femtosecond or picosecond pulses. The present lasers are mode-locked solid-state lasers with questionable reliability. It would be preferable to have a robust fiber laser similar to that which has been developed for the Ti:sapphire regenerative amplifier.

Historically, both Nd: doped crystals and glasses have been the laser material for most solid-state lasers. The only commercially available regenerative amplifiers for picosecond or femtosecond pulse besides Ti:sapphire have been Nd: based materials. Ti:sapphire can produce much shorter pulses. The Nd: crystalline materials such as Nd:YAG, Nd:YLF and Nd:Vanadate produce pulses around 10 picoseconds. The Nd:glass regenerative amplifier produces pulses around 0.5-2.0 picoseconds. The Nd:glass regenerative amplifier is the source used in the Laser-Assisted In-Situ Keratomileusis (LASIK) application and the laser is described by C. Horvath, A. Braun, H. Liu, T. Juhasz and G. Mourou, *Compact Directly Diode-Pumped Femtosecond Nd:glass Chirped-Pulse-Amplification Laser System*, Optics Letters 22 (23): 1790-1792, Dec. 1, 1997.

Recently, there has been interest in replacing Nd: lasers with Yb: lasers. The reasons are related to diode pumping. The absorption transition is broader than the absorption transition in Nd: lasers, so it is easier to tune the laser diodes to the transition. It is also possible to dope the crystals heavily so the diodes are absorbed in a small area leading to higher gain. The final reason is that the transition has a small quantum defect from the laser transition so more efficient lasing is obtained with less heat deposition. The broader transitions also allow shorter pulse generation. A very good review of the advantages of Yb: materials for short pulse is reported by J. Nees, S.

Biswal, F. Druon, J. Faure, M. Nantel, G. A. Mourou, A. Nishimura, H. Takuma, J. Itatani, J. C. Chanteloup and C. Honninger, *Ensuring Compactness, Reliability, and Scalability for the Next Generation of High-Field Lasers*, IEEE Journal Of Selected Topics In Quantum Electronics 4 (2): 376-384 March-April 1998.

However, Yb: materials have some idiosyncrasies that make them more challenging to use. Typically, the regenerative amplifier active material is a four level transition and the gain shape is very constant. This is true with Nd: doped materials and Ti:sapphire. An early exception is alexandrite, which has a quasi-three level lasing transition. The spectrum is quite stable but can be tuned for example by the excitation level or by large temperature differences. This was illustrated where the temperature of alexandrite can be used so the gain spectrum of one crystal overlaps the absorption spectrum of another crystal. A room-temperature alexandrite laser can pump another hot alexandrite laser as was disclosed by A. Hariharan et al., *Alexandrite-pumped Alexandrite Regenerative Amplifier for Femtosecond Pulse Amplification*, Optics Letters 21 (2): 128-130, Jan. 15, 1996.

Wavelength shifting of the gain spectrum is also seen in Yb: doped regenerative amplifiers as is shown in FIG. 6 from H. Liu, J. Nees, G. Mourou, S. Biswal, G. J. Spuhler, U. Keller and N. V. Kuleshov, $Yb:KGd(WO_4)^2$ *Chirped-Pulse Regenerative Amplifiers*, Optics Communications 203 (3-6): 315-321, Mar. 15, 2002. In this case, the seed femtosecond pulse was at 1027 nanometers and the output was 1038 nanometers. Thus, to obtain the optimized wavelength, one needs to inject a different wavelength in order to obtain the optimized wavelength. However, Table 1 shows that the optimum wavelength is dependent on loss (OC) and can vary as much as 28 nanometers. In fact, the optimum wavelength changes by 1-3 nanometers per percentage of loss!

For Yb:glass, the spectral shift of the input seed to the output is shown clearly in FIG. 4 from H. Liu, S. Biswal, J. Paye, J. Nees, G. Mourou, C. Honninger and U. Keller, *Directly Diode-Pumped Millijoule Subpicosecond Yb:glass Regenerative Amplifier*, Optics Letters 24 (13): 917-919, Jul. 1, 1999. This behavior is partially explained from the family of curves in FIG. 2 from C. Honninger, R. Paschotta, M. Graf, F. Morier-Genoud, G. Zhang, M. Moser, S. Biswal, J. Nees, A. Braun, G. A. Mourou, I. Johannsen, A. Giesen, W. Seeber and U. Keller, *Ultrafast Ytterbium-Doped Bulk Lasers and Laser Amplifiers*, Applied Physics B-Lasers and Optics 69 (1): 3-17, July 1999. The gain peak changes with excitation dramatically and as the seed pulse is amplified the excitation value is changing with the saturation of the laser material. Table 2 shows that, with a 7% change in loss, the spectral peak moves 30 nanometers and the spectral width changes 65% in Yb:glass. Such specification changes need to be considered for long-term operation where the loss does increase with time.

It should be clear that it is difficult to design the seed laser for Yb: regenerative amplifiers due to the large changes in the center line width and bandwidth caused by pumping level, losses and the Yb: host material.

There are additional differences with Yb: materials that make them challenging. One is the round trip gain is lower compared to that in a Ti:sapphire regenerative amplifier. In order to obtain the required gain, there must be additional round trips in the regenerative amplifier and with more round trips the system is more susceptible to changes in loss due to environment. Also, a 1% change in the round trip loss is a small change in the overall gain when the round trip gain is 200% in Ti:sapphire, but is a very large change in the overall gain when the round trip gain is 10% as is the case in these Yb:doped regenerative amplifiers.

The thin disk configuration is being considered for high power industrial applications. The thin disk refers to doped lasing material where the pump laser is passed multiple times for absorption. The thin disk is mounted on a conductive mirror so that the heat is removed perpendicular to the face of the crystal rather than radially removed in the typical rod configuration. In a thin disk regenerative amplifier, short pulse amplification has been shown without the use of chirped pulse amplifiers. This is possible due to the shorter propagation distances in and larger spot sizes in the thin disk compared to conventional rod solid state desings. This work has been reported by C. Honninger, I. Johannsen, M. Moser, G. Zhang, A. Giesen and U. Keller, *Diode-Pumped Thin-Disk Yb: YAG Regenerative Amplifier*, Applied Physics B-Lasers And Optics 65 (3): 423-426, September 1997. More recent results have been published by M. H. Niemz, A. Kasenbacher, M. Strassl, A. Backer, A. Beyertt, D. Nickel and A. Giesen, *Tooth Ablation Using a CPA-Free Thin Disk Femtosecond Laser System*, Applied Physics B-Lasers And Optics 79 (3): 269-271, August 2004. The laser system is described in International Application No. WO 04/068657 A1. In these experiments, a Yb:YAG and a Yb:glass mode-locked laser have been used as the seed source, respectively. These sources have not met the required stability for an industrial source and there has been great interest in developing stable mode-locked fiber lasers for this application.

A fiber laser has been built to seed an Yb: based regenerative amplifier. A brief description of this fiber laser for this application is given in U.S. Pat. No. 6,760,356, the disclosure of which is incorporated by reference in its entirety. This fiber laser is based on the identical erbium mode-locked laser that operates at 1.55 micrometers and is converted to 780 nanometers for seeding Ti:sapphire regenerative amplifiers. However, the frequency is converted to 1040 nanometers for injection seeding the Yb: regenerative amplifier. This fiber laser system is described in detail in co-pending U.S. application Ser. No. 09/576,772 entitled MODULAR, HIGH ENERGY, WIDELY-TUNABLE ULTRAFAST FIBER SOURCE and was reported by M. E. Fermann, A. Galvanauskas, M. L. Stock, K. K. Wong and D. Harter, *Ultrawide Tunable Er Soliton Fiber Laser Amplified in Yb-Doped Fiber*, Optics Letters, Vol. 24, No. 20 pp. 1428-1430, Oct. 15, 1999.

However, it is now desirable to have a simpler laser and thus more cost effective solution. An early experiment in injection seeding with a fiber laser is described by M. Hofer, M. H. Ober, F. Haberl, M. E. Fermann, E. R. Taylor and K. P. Jedrzejewski, *Regenerative Nd Glass Amplifier Seeded with a Nd Fiber Laser*, Optics Letters 17 (11): 807-809, Jun. 1, 1992. However, this fiber laser required 6 prisms intracavity and over a meter of free intracavity spacing, and thus, this laser is no more than a proof of principle demonstration.

Co-pending U.S. application Ser. No. 09/576,772, filed May 23, 2000, which is assigned to the common assignee and the disclosure of which is incorporated by reference in its entirety, discloses the use of a Yb: oscillator, which can be used for the seed source of regenerative amplifiers with the additional system considerations described here.

SUMMARY OF THE INVENTION

As mentioned earlier, Yb: sources do not have stable spectral performance. The central wavelength changes with changes in pulse energy or extra loss in the cavity with time. Wavelength shifts due to additional losses cannot be corrected by increasing the pump level. Additional losses due to dirty intracavity optics or mirrors or misalignment are not wavelength dependent but additional gain from higher excitation modifies the spectral gain profile of the regenerative amplifier. There are a number of different means to control the spectral output of the regenerative amplifier directly, such as an intracavity tuning element. However, these elements will narrow the spectral output and broaden the temporal pulse output. The present invention is directed to spectral control of the seed source.

The present invention has been made in view of the above circumstances and to overcome the above problems and limitations of the prior art, and provides a Nd: or Yb:doped fiber mode-locked oscillator, a Nd: or Yb:doped fiber amplifier and a Yb: or Nd:doped solid state regenerative amplifier that has been optimized for long term operation in industrial applications. The invention takes advantage of the unique properties and divergent optical properties of these systems. Regenerative amplifiers based on Nd: and Yb: have low cross sections that give large energy storage but lower gain. The lower gain affects long-term stability and needs to be carefully considered in system design. Gain shaping is very prevalent in Yb: materials. The Yb: lasing transition is a quasi three level transition and the gain position is very dependent on excitation and pump power. This leads to spectral shifting as the gain in the regenerative amplifier is saturated. The output spectrum of the amplified seed pulse is entirely shifted from the spectrum of the input seed source. Spectral matching the seed source to the particular regenerative amplifier needs to be considered as well as spectral instability with time.

Similar affects are also observed and must be considered in Yb:doped fiber amplifiers. A Yb:doped fiber mode-locked laser can operate from 980 nanometers to 1100 nanometers. These sources can be the seed source for any of the different Yb: or Nd: materials utilized in the regenerative amplifier. This allows for some economies, since the same platform can be utilized for all of the regenerative amplifier designs. However, along with the larger flexibility for lasing wavelength due to the large bandwidth of Yb:doped fiber comes the need for control in matching the spectral central wavelength and bandwidth of the regenerative amplifier over a long period of time. One of the aspects of the present invention addresses these issues.

The particular building blocks of this system are an Yb:doped fiber oscillator, one or two pulse stretchers, an Yb:doped fiber amplifier, and a Yb: or Nd: doped solid state regenerative amplifier. At each stage, there is the potential of flexibility and control of the center wavelength and the bandwidth of the spectral output. This flexibility allows the Yb: oscillator to be used for each of these different systems, but requires a level of control to design a system that will remain reliable for a number of years. Issues concerning the central wavelength of the spectrum and the spectral width need to be addressed.

The central wavelength in each of the main modules in this system is flexible. For a Yb: doped fiber mode-locked oscillator, there are two basic designs for this source in terms of central wavelength. One design uses a tuner in the laser that determines the central wavelength and the spectral width by the bandwidth of the tuner. This design produces a narrow spectral width and gives longer pulses. It is more flexible since the mechanical position of the tuner, which is fixed, determines the wavelength. Means of controlling and stabilizing the wavelength for the system can be in the oscillator. Methods of controlling the wavelength include tuning with an intracavity grating pair as reported by L. Gomes, L. Orsila, T. Jouhti and O. Okhotnikov, *Picosecond SESAM-Based Ytterbium Mode-Locked Fiber Lasers*, IEEE Journal of Selected Topics in Quantum Electronics, Vol. 10, No. 1, pp. 129-136, January/February 2004. Other means of tuning the wavelength are stretching or compressing a fiber grating, temperature control of a fiber grating or the use of an intracavity etalon. For long term stability, a feedback circuit can be utilized to stabilize wavelength. Spectral measurement can be accomplished by photodiodes measuring transmission through the fiber grating stretcher or etalon. Another is reflections off a bulk stretcher or compressor grating. It is preferable to measure the spectrum after the regenerative amplifier since with time the wavelength of the oscillator may be changed to keep the regenerative amplifier operating at the same wavelength.

The second means of designing a mode-locked fiber oscillator is to utilize the Yb:glass spectral bandwidth without an intracavity line narrowing element. These oscillators have larger spectral widths and shorter pulses than the design discussed above. The center wavelength and spectral width are then determined by the particular design parameters, e.g., the Yb: ion doping concentration in the fiber, the excitation level of the amplifier, the length of the fiber amplifier, saturable absorber design, cavity dispersion, pump wavelength and the excitation level along the length of the Yb:doped fiber. Examples of this type of design include the fiber lasers described in U.S. Pat. Nos. 5,689,519 and 5,617,434 and U.S. Patent Publication No. 20040114641 A1. Some wavelength selection can be used in these designs also. These oscillators have less flexibility with tuning but, in general, can be designed to operate at predefined wavelengths. The spectral width also can be adjusted to some point but may be too broad for some materials. The stretcher can also be used for shaping the spectral pulse shape moving the center and changing the width. Since any spectral narrowing component is a loss element, it should be performed before the fiber amplifier. The fiber amplifier is operated typically far in saturation and thus its efficiency is rather insensitive to the input pulse energy. The spectral output of a mode-locked fiber oscillator is sufficiently stable for long-term injection into a typical regenerative amplifier and feedback is not necessary with this laser as should be considered for the tunable mode-locked fiber laser.

It is anticipated with time the loss in the regenerative amplifier will increase from slight misalignment of the cavity, dirt on the optical surfaces, slight misalignment of the Pöckels cell or a slight drift of the voltages on the Pöckels cell. This is normal wear on a regenerative amplifier. In a scientific environment, it is standard operating practice to have a scientist realign the regenerative amplifier periodically. For industrial applications, however, this should be avoided. Typically, the increase in loss in a cavity can be compensated for by increasing the gain. However, in the Yb: materials, this changes the gain as a function of wavelength. Typically, this cannot be tolerated since the pulse compressor is wavelength dependent.

Fortunately, there are methods for mitigating this affect. One is to use larger gratings that allow some changes in the central wavelength. Another is to use no pulse compression or CPA as is described for the thin disc regenerative amplifier in M. H. Niemz, A. Kasenbacher, M. Strassl, A. Backer, A. Beyertt, D. Nickel and A. Giesen, *Tooth Ablation Using a CPA-Free Thin Disk Femtosecond Laser System*, Applied Physics B-Lasers and Optics 79 (3): 269-271, August 2004. However, the gain shift can be large enough to move the seed out of the gain profile or to reshape the spectrum of the seed and affect the temporal pulse shape and pulse duration. This can be best understood by looking at the gain profiles of Yb:glass for different pumping rates as shown in FIG. 2 from C. Honninger, R. Paschotta, M. Graf, F. Morier-Genoud, G. Zhang, M. Moser, S. Biswal, J. Nees, A. Braun, G. A. Mourou, I. Johannsen, A. Giesen, W. Seeber and U. Keller, *Ultrafast Ytterbium-Doped Bulk Lasers and Laser Amplifiers*, Applied Physics B-Lasers And Optics 69 (1): 3-17, July 1999. If the seed is around 1.05 micrometers with 2.5% excitation level and the gain needs to be increased to the 5% excitation level, then part of the spectrum of the seed will go from having no gain to being at the peak gain of the regenerative amplifier. Injection to the blue part of the gain profile will see the most change in spectral reshaping. However, if the seed is at 1.08 micrometer and the loss is increased by 0.03 uniformly with wavelength, then no amount of pumping will give net gain at that wavelength. This part of the spectrum moves outside the spectral window with gain. A more likely scenario is that the seed would be at a wavelength near 1.05 micrometers. As gain is increased in the regenerative amplifier, to mitigate loss, the gain slope will increase and the spectral shifting will be increased. To maintain the output wavelength, two solutions are proposed. One solution is to increase the seed input energy, since the amount of shift depends on the overall gain, and the overall gain can be decreased by increasing the input. The other solution is to red shift the seed so that the overall shift does increase, but the wavelength of the output remains the same.

There are a number of ways to shift the central wavelength in the fiber source that will be discussed in the specific embodiments. The other issue is matching the spectral width of the Yb: fiber seed source to the needed spectral width for the regenerative amplifier. Typically, the spectral width will be too large from the Yb: oscillator directly. Therefore, means to reduce the bandwidth efficiently are desirable. The Yb: oscillator can be designed also to have the same or smaller bandwidth than that needed to seed the regenerative amplifier. In these cases, the bandwidth would need to be kept the same or increased in the fiber amplifier.

An additional improvement for these lasers that is not possible with solid-state oscillators is that the repetition rate can be lowered to match the repetition rate of the regenerative amplifier while significantly increasing the pulse energy from the fiber amplifier. The lower repetition rate reduces the tolerances on the Nickels cell switch in the regenerative amplifier. With 50-100 megahertz sources, the Nickels cell needs near 100% discrimination to prevent two pulses from being injected and amplified. If the repetition rate of the fiber amplifier is equal to the repetition rate of the regenerative amplifier, there is no need for discrimination between pulses and there just needs to be sufficient loss to hold off spontaneous lasing of the regenerative amplifier. The single pass gain is 5-30%, so this is the loss needed. Higher seed energies are also desired to reduce gain narrowing in the regenerative amplifier. Higher pulse energies also increase the stability of a low gain regenerative amplifier. It is not necessary to match the repetition rates of the injection seed and the regenerative amplifier. However, it will give the highest injection pulse energy. There may be reasons for minimizing the pulse energy in the fiber amplifier. The AOM will only be beneficial if the pulse that normally precedes the pulse injected into the regenerative amplifier is blocked by the AOM.

Additional aspects and advantages of the present invention will be set forth in part in the description that follows and in part will be obvious from the description, or may be learned by practice of the present invention. The aspects and advantages of the present invention will become apparent from the following detailed description and with reference to the accompanying drawing figures, and may be realized and attained by means of the instrumentalities and combinations particularly pointed out in the appended claims.

BRIEF DESCRIPTION OF THE DRAWINGS

The accompanying drawings, which are incorporated in and constitute a part of this specification illustrate embodiments of the invention and, together with the description, serve to explain the aspects, advantages and principles of the invention. In the drawings.

DETAILED DESCRIPTION OF THE INVENTION

Figure 1:
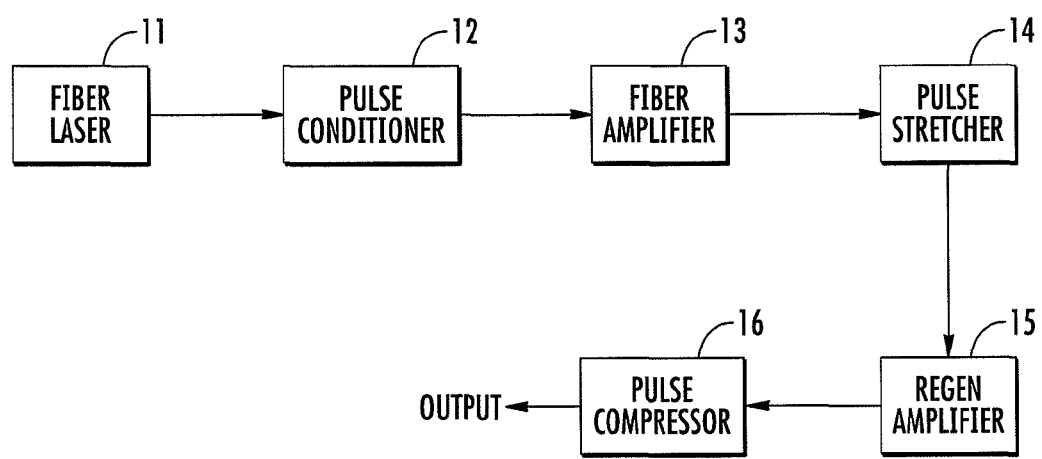
FIG. 1 is a block diagram on the basic components of the present invention.

A generalized illustration of the system of the invention is shown in FIG. 1. The pulses are generated in the Yb: or Nd: doped fiber mode-locked oscillator 11. These are coupled into a pulse conditioner 12 for spectral narrowing, broadening or shaping, wavelength converting, temporal pulse compression or stretching, pulse attenuation and/or lowering the repetition rate of the pulse train. The pulses are subsequently coupled into an Yb: or Nd: fiber amplifier 13. Pulse stretcher 14 provides further pulse stretching before the amplification in the regenerative amplifier 15 that is based on an Nd: or Yb: doped solid-state laser material. The compressor 16 compresses the pulse back to near transform limit. The six subsystems can be utilized to various degrees as is described in the subsequent embodiments.

Figure 2:
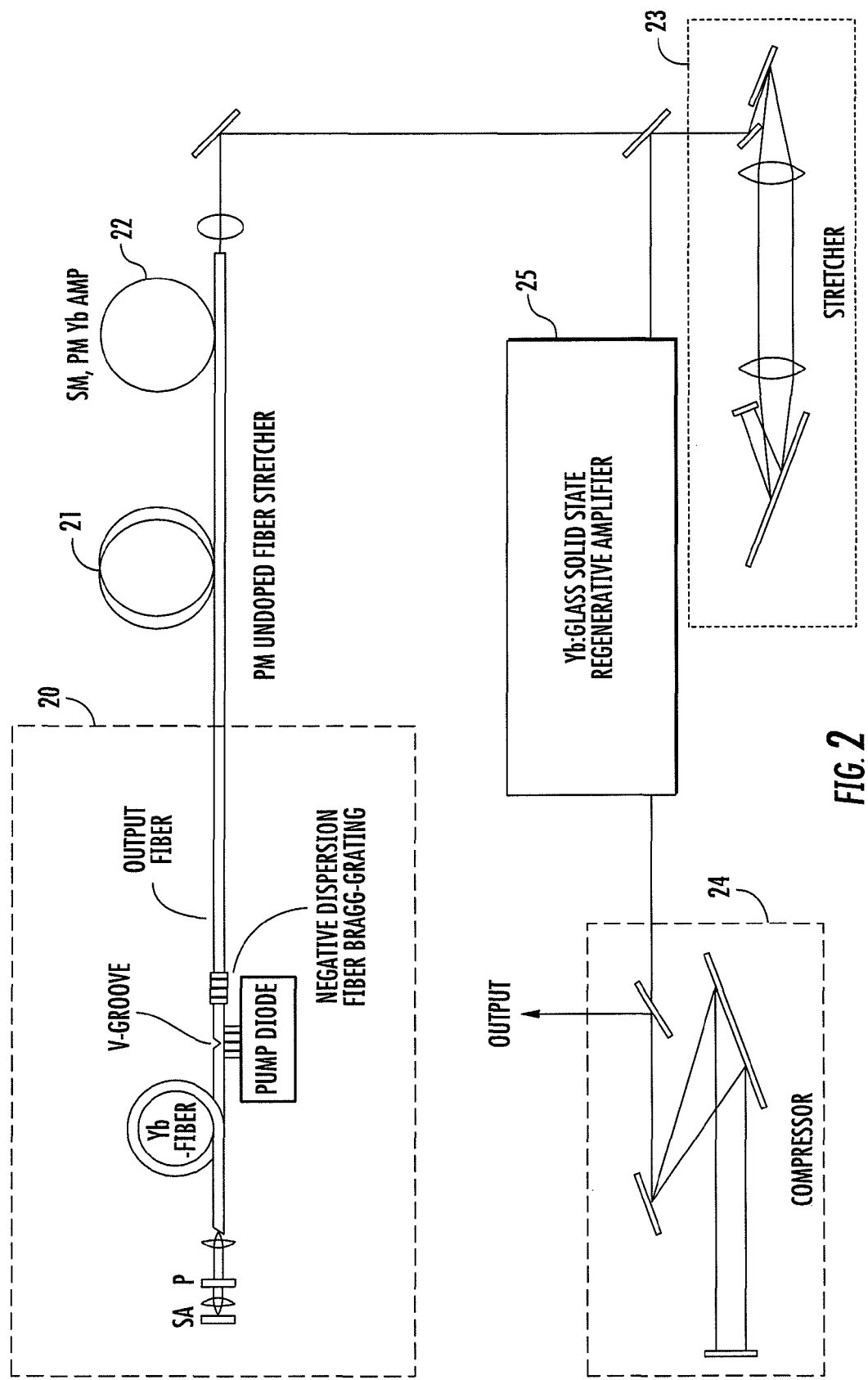
FIG. 2 is an embodiment of the present invention that uses a Yb:glass regenerative amplifier.
Figure 8:
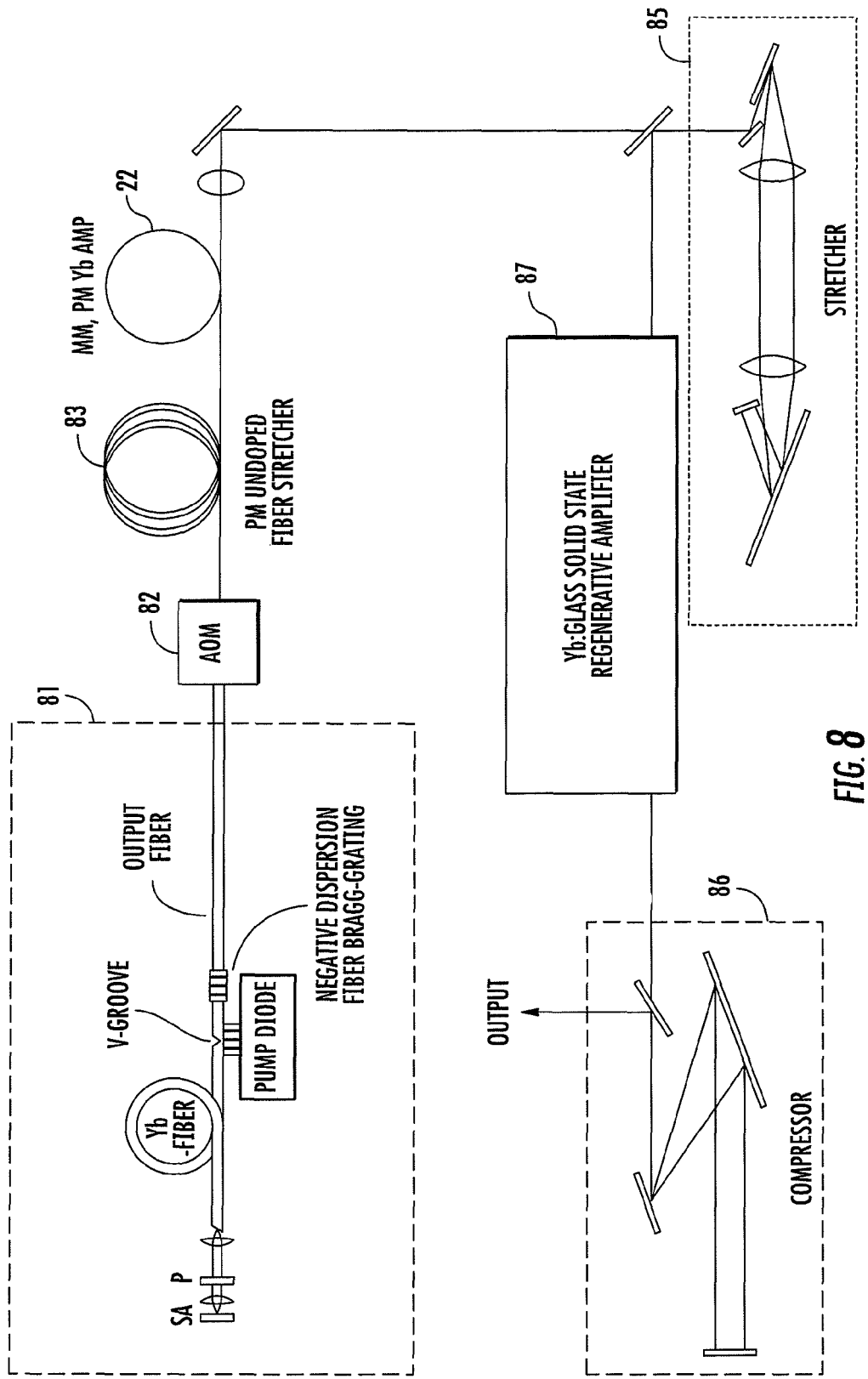
FIG. 8 is another embodiment of the present invention that uses a Yb:glass regenerative amplifier and an acoustic-optical modulator.

The first embodiment is shown in FIG. 2. The Yb: oscillator 20 is the same as shown in FIG. 8 of co-pending U.S. application Ser. No. 09/576,772. The pulse width of the oscillator is 200 femtoseconds. The spectral width is about 12 nanometers and the wavelength centered at 1053 nanometers. The repetition rate of the oscillator is about 50 MHz and the average power about 10 milliwatts. This oscillator is shown to be cladding pumped but core pumping may also be utilized and desirable. It is desired to maintain the spectral width of this pulse and the ability to recompress this pulse at the end of the system. A polarization-maintaining fiber 21 is spliced to the oscillator with sufficient positive dispersion to stretch the pulse to 8 picoseconds. An isolator may be placed between the oscillator and the stretching fiber to make the design more robust. A core pumped Yb: amplifier 22 then amplifies this pulse. In the amplifier 22, the center wavelength remains at 1053 nanometers. The pulse stretcher 23 is sufficient to prevent nonlinear effects as the pulse is amplified up to an average power of 200 milliwatts or pulse energy of 4 nanojoules in the optical fiber. The stretching before the amplifier was described in co-pending U.S. application Ser. No. 09/576,772, and utilized in the laser described and utilized in U.S. Pat. No. 6,760,356. This 8 picosecond pulse can be further stretched to 100 picoseconds with a bulk grating stretcher of the Martinez design before amplifying in a Yb:glass amplifier 25 to a pulse energies greater than one microjoule.

The compressor 24 can be utilized to compensate for the dispersion of both stretchers as well as the dispersion of the amplifier and to compress the pulses close to the transform limit near 250 femtoseconds at a repetition rate near 10-100 kilohertz. This embodiment can be altered to have all the pulse stretching before the fiber amplifier 22. However, the stretching can be done by a linear fiber grating and/or a combination of fibers with different dispersion as is disclosed in FIGS. 5, 12 and 13 co-pending U.S. application Ser. No. 09/576,772. It can also be a non-linear chirped fiber grating that matches the compression of the bulk compressor after the regenerative amplifier as is also disclosed in co-pending U.S. application Ser. No. 09/576,772.

This same embodiment can be utilized with a Yb:KGd (WO$_4$)$^2$ regenerative amplifier. A similar 200 femtosecond source is utilized that is tuned designed to operate between 1040 to 1048 nanometers.

Figure 3:
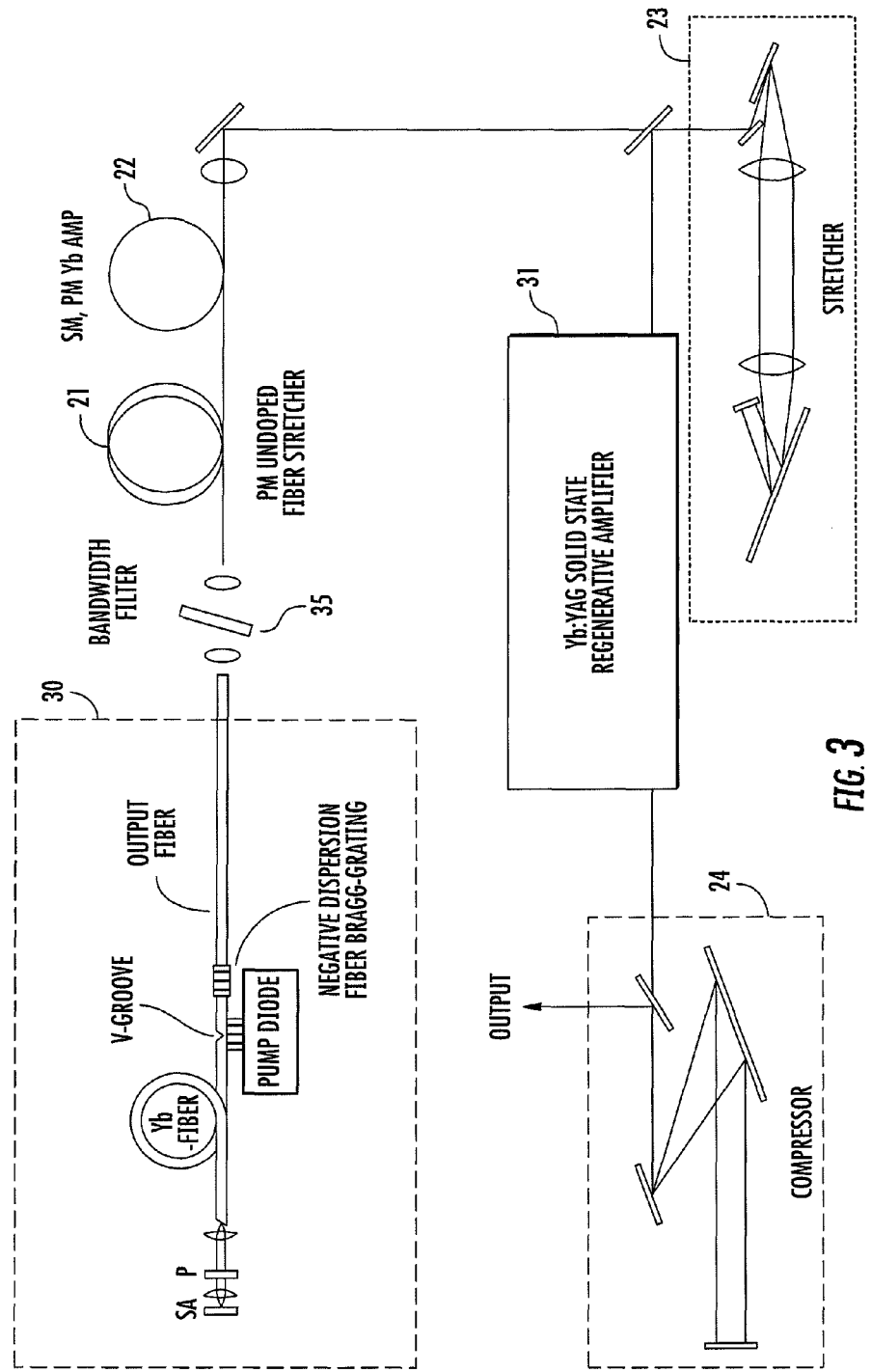
FIG. 3 is another embodiment of the present invention that uses a Yb:YAG regenerative amplifier.
Figure 9:
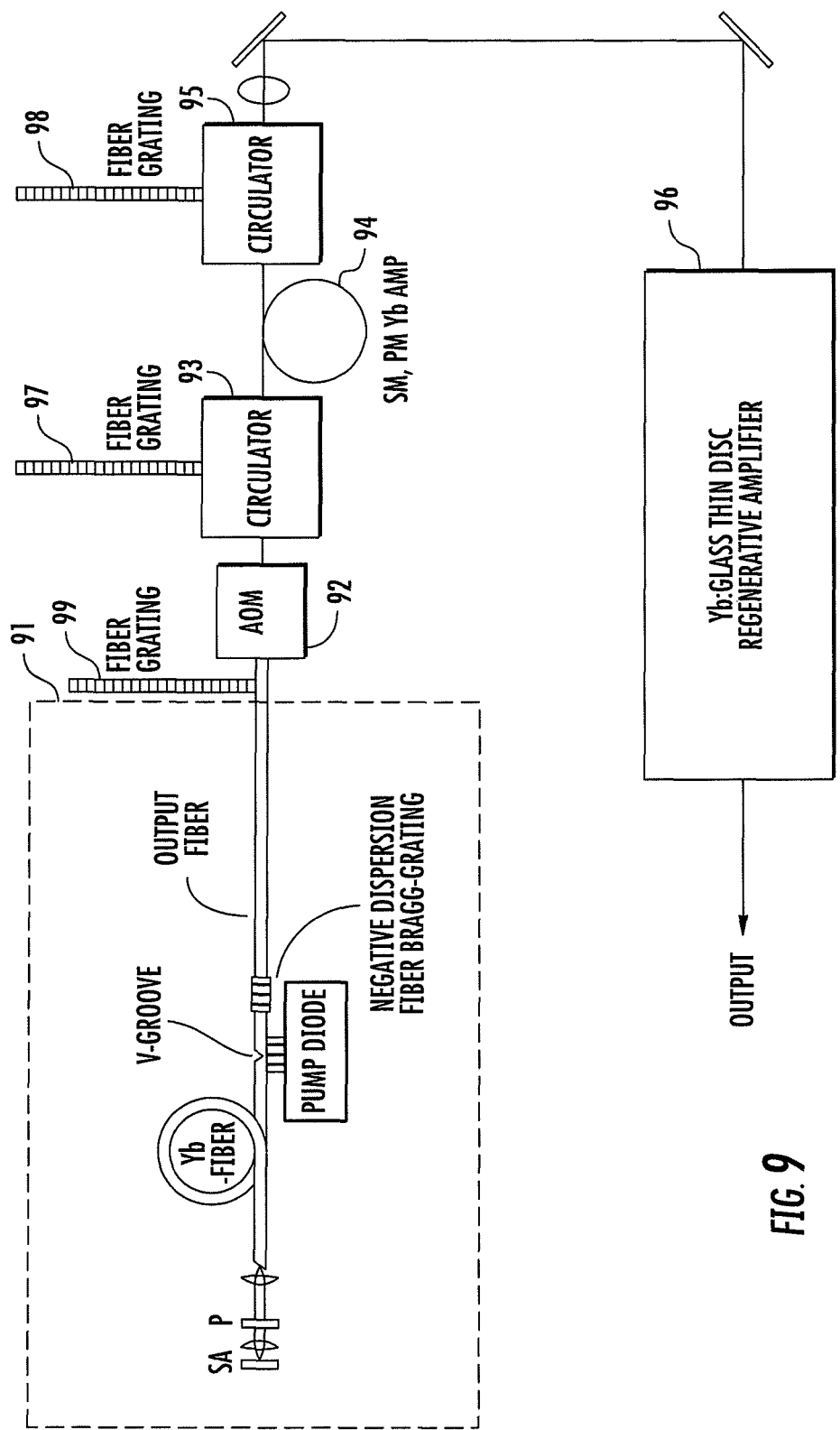
FIG. 9 is another embodiment of the present invention that uses a Yb:glass regenerative amplifier, an acoustic-optical modulator and fiber gratings for pulse stretchers.

In another embodiment shown in FIG. 3, the regenerative amplifier 31 is based on crystalline Yb: materials, such as Yb:YAG, where the spectral width is somewhat narrower than the oscillator utilized in the primary embodiment and can amplify longer pulses around 800 femtoseconds. The oscillator 30 can be spectrally narrowed by redesigning the oscillator with an intracavity filter. A fiber grating that is spectrally narrowed can be used to accomplish the required spectral narrowing. However, a filter 35 based on an etalon or fiber grating can be utilized after the oscillator and before the amplifier as is shown in FIG. 9 of co-pending U.S. application Ser. No. 09/576,772. More specifically, the filter can also be placed between the oscillator and the fiber stretcher as shown or between the fiber stretcher and the fiber amplifier.

In addition, the embodiment can be modified to be utilized for crystalline Yb: and Nd: doped materials that have a spectral bandwidth that can only amplify pulses longer than 500 femtoseconds. These materials include, but are not limited to, Nd:YAG, Nd:YLF and Nd:Vanadate. Regenerative amplifiers of Nd:YLF and Nd:Vanadate are available from commercial sources with output pulse widths of 8 and 12 picoseconds, respectively. Since these pulse widths and the 200 femtosecond pulse width are near transform limited, the source has a spectral width 8 picoseconds/0.2 picoseconds (40) and 12 picoseconds/0.2 picoseconds (60) times broader respectively. Thus, only 1/40 to 1/60 of the pulse energy gets amplified and the required seed pulse energy increases by 40 to 60 times. To avoid a need for this larger pulse energy, the spectrum can be narrowed before or during amplification in the fiber amplifier. Loss from spectral narrowing before amplification is extremely efficient since the efficiency of the fiber amplifier is relatively insensitive to the input power. Means for narrowing the spectrum is a thin film bandpass filter 35 or a fiber grating. The fiber grating can also be utilized for dispersion management. For these longer pulses, chirped pulse amplification is normally not used since the compressors and stretchers become inordinately large and amplification to the one millijoule range is possible in bulk materials without nonlinear affects. Spectral compression can also be accomplished in the fiber by either the use of a fiber with anomalous dispersion or a chirped pulse input. It is difficult to narrow the spectrum in the fiber by nonlinear spectral compression by a factor of 40 or 60 times. Thus, spectral narrowing by a filter or a fiber grating may need to be used in combination. It is important to use an apodized fiber grating since ripple in the spectrum from steep edged gratings causes unacceptable pulse distortions.

Figure 4:
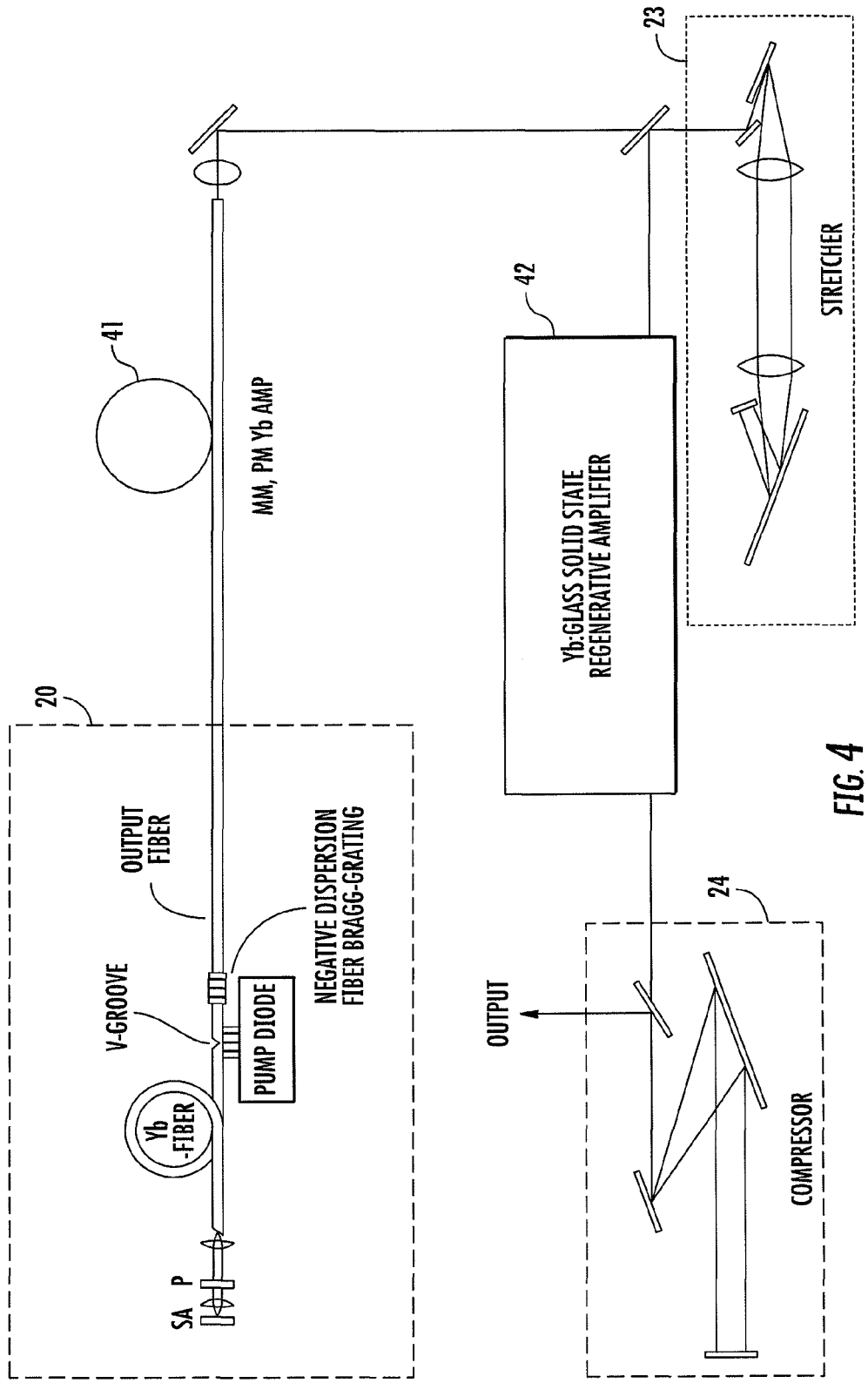
FIG. 4 is another embodiment of the present invention that uses a Yb:glass regenerative amplifier.
Figure 5:
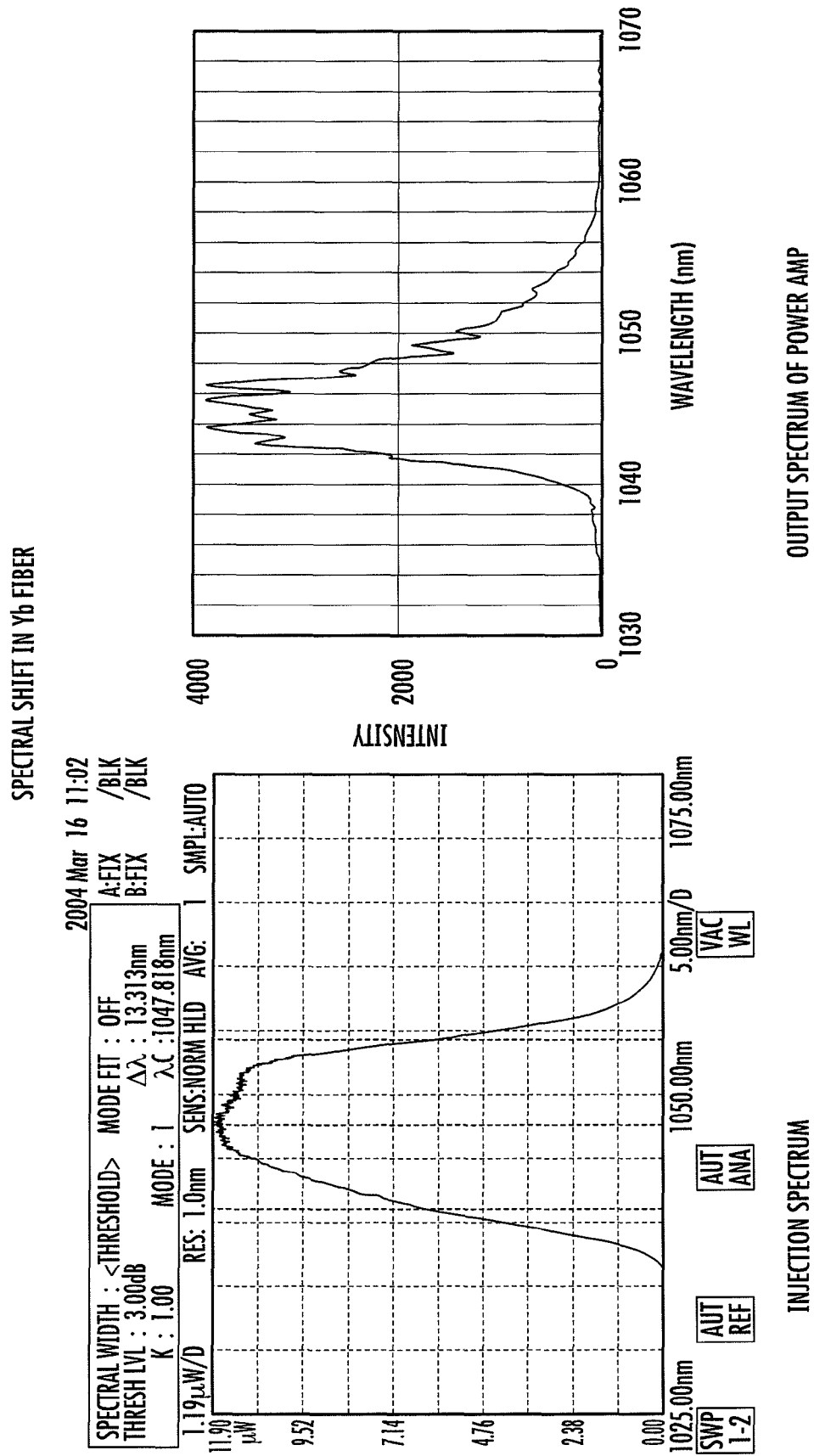
FIG. 5 illustrates the spectral shift in Yb:fiber.

In an alternative embodiment shown in FIG. 4, it may be preferred not to stretch the pulses but to utilize a multimode fiber 41 to amplify the single mode. The area of the fiber can be increased so that spectral broadening can be avoided. A similar oscillator 20 is utilized that outputs 200 femtosecond pulses. The spectral width is about 13 nanometers and the wavelength centered at 1058 nanometers. The repetition rate of the oscillator 20 is about 50 megahertz and the average power about 10 milliwatts. This pulse is then amplified by a multimode fiber amplifier 41 with a core diameter of 30 micrometers and a V number of 5. In the fiber amplifier 41, the center wavelength is shifted by 5 nanometers to 1053 nanometers. An example of the shift of the spectra in a fiber amplifier is illustrated in FIG. 5. This example is FIG. 6 from U.S. Provisional Patent Application No. 60/539,110, which is incorporated by reference in its entirety. The peak of the input spectrum is 1047 nanometers and the peak of the output spectrum is 1045 nanometers. The spectrum is also narrowed from 13 nanometers to 6 nanometers. The output pulse is stretched minimally from the dispersion of the fiber amplifier 41 to approximately one picosecond. The pulse is further stretched in a bulk grating stretcher 23, amplified in a Yb:glass regenerative amplifier 42 and compressed back to 250 femtoseconds in a bulk grating compressor 24. The frequency shift in the fiber amplifier 41 can be used to tune the oscillator wavelength to the regenerative amplifier 42 wavelength. This shift normally will also narrow the spectrum of the pulse. Typically, if the fiber amplifier 41 is uniformly and highly excited, then the input seed wavelength will be shifted toward the gain center. However, if the fiber amplifier 41 is an overly long and co-propagating pump, the later end of the fiber amplifier 41 will not be as highly pumped and will have gain center toward 1.06 micrometers while there is substantial loss near 1.04 micrometers. This fiber amplifier 41 can shift the frequency from 1.04 micrometers to longer wavelengths. This amplifier 41 can then be used to change the spectral shift with time. The amplifier 41 can be pumped both a co-propagating pump laser and a counter-propagating pump laser. By varying the pump power of the two pump lasers, the wavelength can be shifted. This will also be suitable for any fiber amplifier 41 including a single mode core pumped amplifier. An alternative to the multimode fiber amplifier with a solid core is a multimode photonic crystal fiber amplifier as described in co-pending U.S. application Ser. No. 10/927,374, which is assigned to the common assignee.

Another example utilizing the wavelength shift of the fiber amplifier is in the case of injecting a regenerative amplifier at wavelengths shorter than the central wavelength such as at 1030 nanometers. It is difficult to operate the short pulse fiber oscillator without tuning elements at this wavelength since it is difficult to move the gain center to this wavelength without very high gain. Thus, the oscillator operates at around 1033 nanometers. Then the amplifier is designed to be short, highly excited with core pumping and high concentration so its gain center is shorter than 1030 nanometers. It then pulls the wavelength of the oscillator to 1030 nanometers. The spectral width is also narrowed from around 13 nm to 6 nm as is desired. In this case, the fiber amplifier gain can be used to give a variable blue shifting of the seed to the regenerative amplifier in order to stabilize the output wavelength of the regenerative amplifier.

Figure 6:
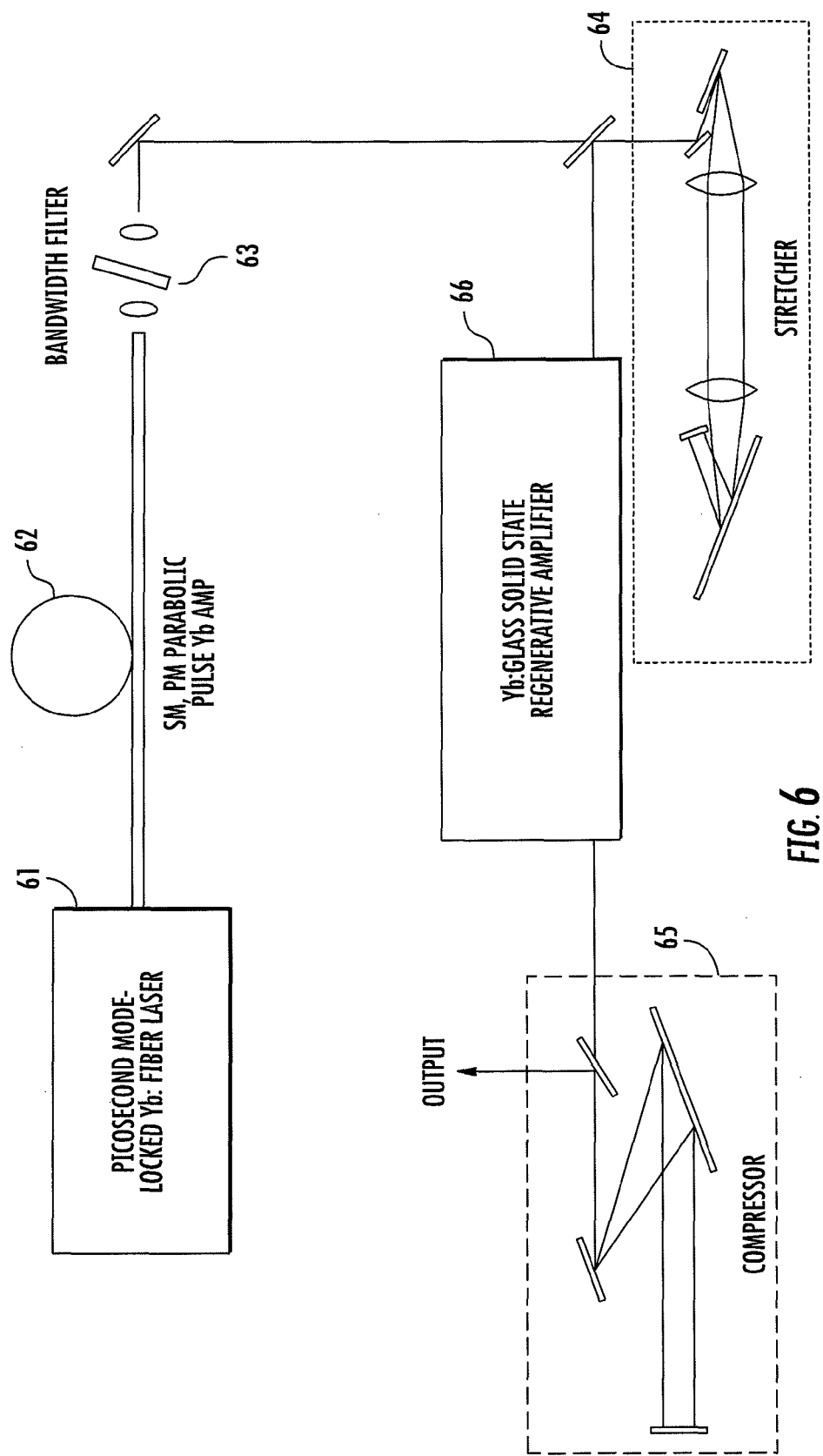
FIG. 6 is another embodiment of the present invention that uses a Yb:glass regenerative amplifier.

In another embodiment shown in FIG. 6, a mode-locked fiber source 61 can be utilized that has a narrower spectrum and longer pulse width than is needed for injection seeding the Yb:glass or Yb:KGd(WO$_4$)$^2$ regenerative amplifiers 66. This optical source can be then spectrally broadened in a Yb: amplifier 62 operating as parabolic pulse amplifier as disclosed in co-pending U.S. application Ser. No. 09/576,772. A suitable source is the Femtomaster1060 from Fianium or the source described by L. Gomes, L. Orsila, T. Jouhti and O. Okhotnikov, *Picosecond SESAM-Based Ytterbium Mode-Locked Fiber Lasers*, IEEE Journal of Selected Topics in Quantum Electronics, Vol. 10, No. 1, pp. 129-136, January/February 2004. The output pulses from this mode-locked Yb: fiber laser have an average power of 10 milliwatts, a center wavelength between 1040 and 1120 nanometers, a temporal width of 3 picoseconds and a bandwidth of 0.35 nanometers. An advantage of a narrow spectral width mode-locked fiber laser is that it can have an intracavity tuning element and thus be tunable. If the pulse is spectrally broadened, it is important that it be linearly chirped so that it can be compressed to near its bandwidth limit. Often, the spectral wings of the pulse are not recompressable. These wings can be filtered out in a bandwidth filter 63 before the pulse stretcher 64, but energy is lost on the output. It is advantageous to spectrally filter the pulse after the amplification in the parabolic pulse amplifier 62. The pulse stretcher 64 can also be utilized as a spectral filter. The gain profile of the regenerative amplifier 66 can be used. The spectral width from the parabolic pulse amplifier 62 must be broader than the gain bandwidth. Designing the system such that the spectral broadening by the parabolic pulse amplifier 62 is greater than the spectral transmission of the spectral filter will assure a more linear chirp and a cleaner output temporal pulse from the regenerative amplifier 66. In a nonlinear amplifier, the pulse will be amplified from the picojoule range to near 4 nanojoules, the spectrum will be broadened to be equal to or greater than the spectral gain width of the regenerative amplifier 66, which is near 10 nanometers, and the pulse will be stretched to around 10 picoseconds in the parabolic pulse amplifier 62. Normally, the pulse would be recompressed before stretching in the regenerative amplifier stretcher as was mentioned before. However, the compressor 65 can compensate for this stretching and the stretching in the pulse stretcher 64 for the regenerative amplifier 66.

Figure 7:
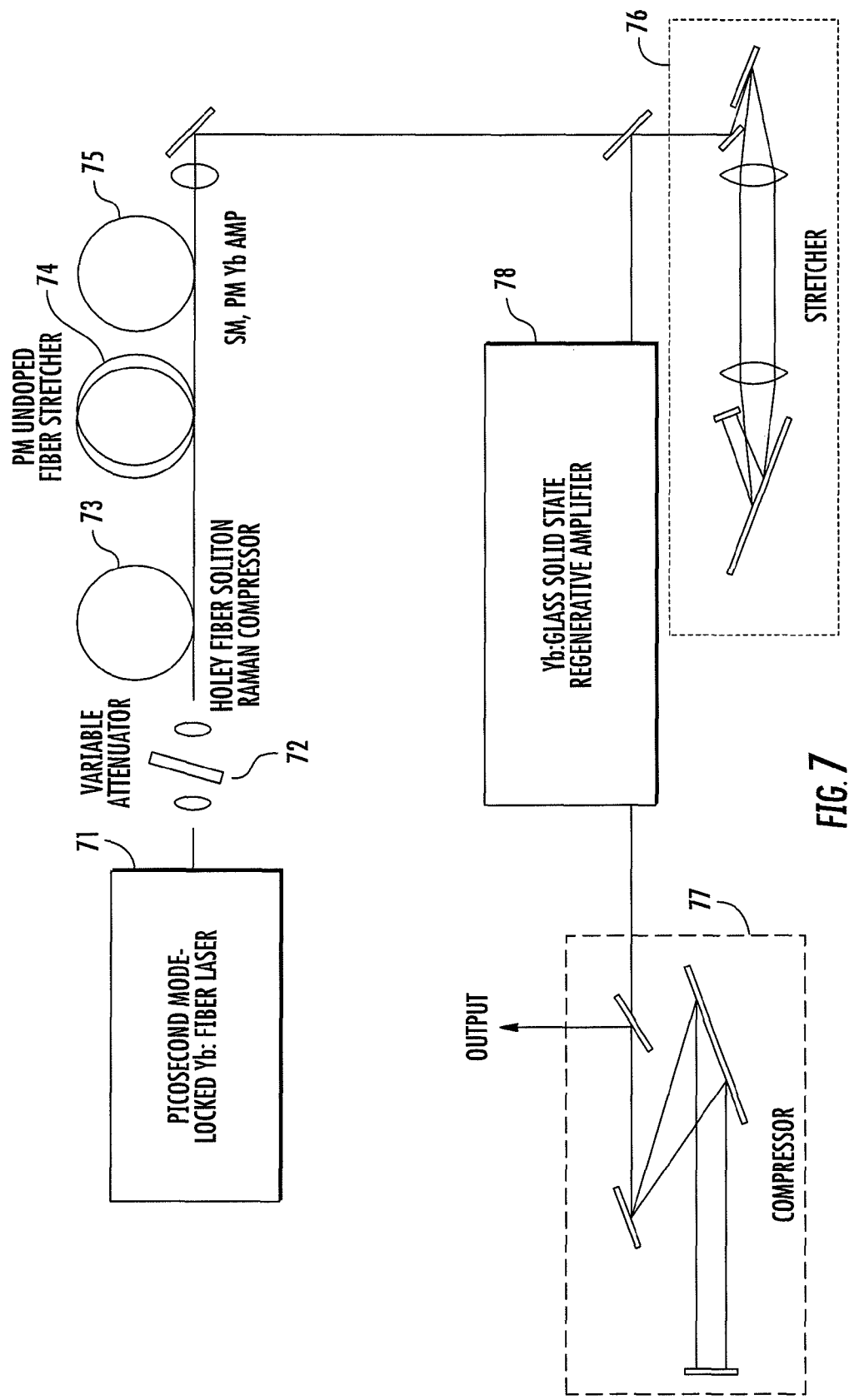
FIG. 7 is another embodiment of the present invention that uses a Yb:glass regenerative amplifier and a Raman Soliton compressor.

An alternative embodiment utilizing the long pulse Yb:fiber mode-locked laser is shown in FIG. 7. In this case, a Raman Soliton compressor 73 is utilized for frequency tuning and for compressing the laser pulse to the required 200 femtosecond pulse for Yb:glass. The Raman Soliton compressor 73 requires negative dispersion fiber and for wavelengths from 0.78 to 1 micrometer, and a holey fiber is disclosed in co-pending U.S. application Ser. No. 09/576,772. A similar disclosure of this source is in U.S. Patent Publication No. 2002/0168161. The pulse is now similar to that generated from the short pulse mode-locked laser and requires some stretching or a multimode amplifier as was described previously.

For many of the new applications in micromachining, it is desirable to have pulse repetition rates greater than 10 kilohertz. It is difficult to design an electro-optic modulator that can operate at greater than 10 kilohertz and particularly from 100-500 kilohertz. Until recently, the only regenerative amplifier operating in this regime has been a Ti:sapphire system called the REGA by Coherent that utilizes an AOM modulator. This laser is described by T. B. Norris, *Femtosecond Pulse Amplification at 250 kHz With a Ti:Sapphire Regenerative Amplifier and Application to Continuum Generation*, Optics Letters 17, 1009, (1992). However, the AOM is too lossy to be utilized with Nd: and Yb: doped materials. The problem with the EO is best understood by explaining the different steps in its operation. This is well explained by D. Harter and P. Bado, *Wavelength Tunable Alexandrite Regenerative Amplifier*, Applied Optics 27 (21): 4392-4395, Nov. 1, 1988. There is the 1) holding off the lasing, 2) switching in a single pulse, 3) reducing the loss to near zero for the entire buildup time, and 4) the switching out of one pulse. Holding off lasing only requires a loss equal to the gain that is about 10% in these materials. Switching in a single pulse is a rigorous requirement, since it requires the other pulses in the pulse train not to remain in the cavity. Thus, a 100:1 ratio is required. Reducing the loss to near zero for the entire build-up time requires also about a 100:1 ratio. This is difficult if the need is to switch from a quarter wave for no gain to keep only one pulse to enter the cavity and then to switch to zero wave retardation. These crystals are piezoelectric and acoustic ringing changes the birefringence over the build-up time of the regenerative amplifier. Recent progress has been made by the utilization of new materials as is described in International Application No. WO 04/057412 A2. However, it would be desirable to have the switching state not from quarter wave for 100% loss for step 2) but less in order to give the 10% loss required to hold off lasing for step 1). The voltage is less and the piezoelectric effect is less so step 3), reducing the loss to near zero for the entire buildup time is also much simpler.

A way of removing the need for step 2, switching in a single pulse, is to add a second Pöckels cell or an EO switch between the high repetition source and the regenerative amplifiers. The repetition rate of the pulses reaching the regenerative amplifier is reduced to the repetition rate of the regenerative amplifier so there is only one pulse present to be switched in. This is what has been implemented in the design for the thin disk regenerative amplifier described in International Application No. WO 04/068657 A1 as mentioned above. However, in a fiber laser source, there is a better alternative for placing an AOM between the fiber oscillator and the fiber amplifier as shown in FIG. 14 of co-pending U.S. application Ser. No. 09/576,772. The advantage here is the loss of the AOM is not important, and if the fiber amplifier is operated in the 10-500 kilohertz range of the regenerative amplifier rather than the 50-100 megahertz range of the fiber mode-locked oscillator, then the pulse energy out can increased by a factor of 100. This is an extreme advantage for the regenerative amplifier. With such a low gain for Nd: and Yb: regenerative amplifiers, there needs to be many passes through the regenerative amplifier, which makes the system very sensitive to changes in intracavity loss, thus by decreasing the needed overall gain, the system becomes less sensitive. Also, less overall gain needed from the narrow line width regenerative amplifier reduces gain narrowing so shorter pulses are possible.

An embodiment of this design is shown in FIG. 8. A short pulse Yb:fiber mode-locked laser 81 is the source. The pulses are stretched to 20-100 picoseconds in a fiber stretcher 83. Other stretchers can also be utilized. The fiber amplifier 84 can be a multimode amplifier and the rest of the system is similar to the embodiment shown in FIG. 2. However, in this particular case, the grating compressor 86 needs to compensate for additional stretching from the fiber stretcher 83.

In addition, the AOM 82 can be utilized to stabilize the regenerative amplifier 87. There is a direct measurement of the change in loss in the regenerative amplifier 87. It is the number of round trips for the pulse to build up to the desired energy. The buildup time is usually measured with a photodiode through a small transmission in one of the cavity mirrors, and when the pulse is at the desired energy, the Pöckels switch is activated to switch out the pulse. This build-up time varies as much as a microsecond but typically slowly with time. This pulse jitter makes it difficult to synchronize to other processes. The AOM 82 can be varied to only partially switch out the pulse so it can operate as a variable attenuator. By varying the injection energy, the buildup time can be stabilized. If the pulse energy from the fiber amplifier 84 is changed dramatically, then the nonlinearity will also change dramatically and needs to be considered. One solution is to use a second AOM or variable attenuator at the output of the fiber amplifier 84. The other is to utilize a short pulse source where the nonlinearities are minimized in the fiber amplifier 84. If the pulse energies are increased by a factor of 100 from nanojoules to hundreds of nanojoules, then a multimode fiber amplifier for amplifying single mode beams can be utilized. The other alternative is for further stretching of the pulse before the fiber amplifier as has been previously mentioned or a grating that matches the dispersion of the bulk grating compressor.

International Application No. WO 04/068657 A1 discloses the amplification of unstretched picosecond pulses in the regenerative amplifier with a compressor. For this design, it is necessary to compensate for the dispersion for each pass in the regenerative amplifier. The concept is to have dispersion compensating elements in the cavity for this purpose. The first 100 femtosecond chirped pulse amplification regenerative amplifier used the concepts reported by M. Pessot, J. Squier, G. Mourou and D. Harter, *Chirped-Pulse Amplification of 100-Fsec Pulses*, Optics Letters 14 (15): 797-799, Aug. 1, 1989. This system was extremely difficult to align and was abandoned. In the fiber system, it may be convenient to pre-compensate for the accumulated dispersion in the cavity. At low pulse energies at the oscillator, a holey fiber that is dispersion shifted to give anomalous dispersion at 1 micron can be utilized. Normally, these fibers have very small cores and are highly nonlinear. Thus, they need to be utilized at low powers. This fiber could also be utilized for broadening the spectrum of the longer pulse and the self-phase modulation can produce the needed chirp.

Another method is to utilize fiber gratings since either sign of dispersion is possible. It may be difficult to get the small amount of dispersion compensation needed from a fiber grating. One possibility is to use a fiber grating with one sign of chirp before the fiber amplifier that is significantly larger than needed. Then, after the fiber amplifier, the opposite chirp is utilized. The fiber gratings are mismatched according to the pre-compensating chirp required. It may be possible to utilize matching fiber gratings and to utilize stretching or heating the gratings in order to obtain the pre-compensating chirp. This would simplify the design of this system since the temperature or stress is changed until the shortest output pulse is obtained. FIG. 9 illustrates such an embodiment. The fiber gratings 97, 98 are illustrated in FIG. 12 of co-pending U.S. application Ser. No. 09/576,772. The pulse stretching from the fiber gratings 97, 98 can be as large as 1 nanosecond for a 10 centimeter grating so a single mode fiber amplifier 94 can be utilized. The second fiber grating 98 is different from the first grating 97 to give the needed pre-compensation to the thin disc regenerative amplifier 96 without chirped pulse amplification. It may also to utilize the first fiber grating 97 as a spectral filter, since the Yb:KYW thin disc regenerative amplifier 96 will not amplify the entire 13 nanometers from the mode-locked laser. The fiber grating 99 stretches the pulses output from the mode-locked laser prior to being input into the acousto-optical modulator 92.

In order for any of the systems to be maintain dispersion compensation, the number of round trips needs to be stabilized or the dispersion compensation needs to be variable. The methods above can be utilized in a feedback system.

Figure 10:
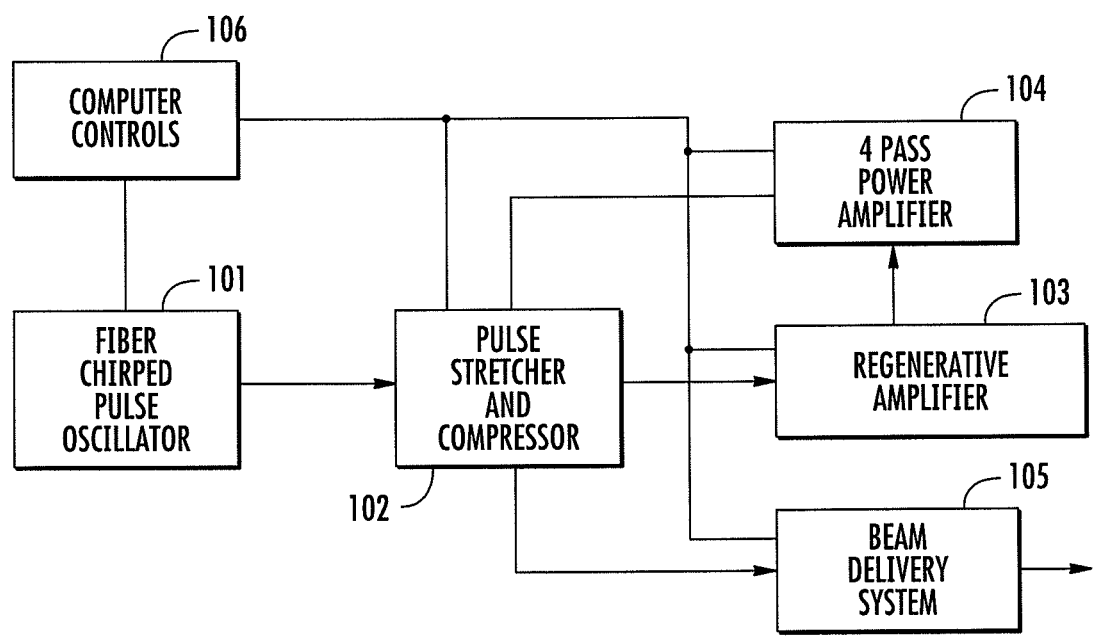
FIG. 10 is another embodiment of a laser system that uses the oscillator and regenerative amplifier of the present invention.

An alternative embodiment of the present invention comprises a controlled chirped-pulse amplified Yb:YAG laser, which is a high average power system that produces short pulse-widths for various applications. As shown in FIG. 10, the overall system contains a laser source 101, a pulse stretcher and compressor 102 (herein referred to as "stretcher-compressor"), a preamplifier 103 constructed to receive stretched laser pulses and to produce amplified stretched pulses, a power amplifier 104 constructed to receive and to produce further amplified stretched pulses, a beam delivery system 105 and a control system to monitor and control laser power levels and maintain alignment 106. The laser source 101 is a commercially available fiber oscillator capable of providing the necessary bandwidth and high repetition rate for the invention. However, any laser material and mode-locking mechanism capable of producing pulses of the desired duration and bandwidth can be employed. Exemplary laser materials include Neodymium(Nd)-doped glass, Neodymium-doped yttrium lithium fluoride, Yb:YAG, Ti:Sapphire, Yb:glass, KGW, KYW, YLF, S-FAP, YALO, YCOB and GdCOB or other broad bandwidth solid state materials that can be diode-pumped to produce lasing gain at the wavelength of the stretched laser pulses.

The stretcher-compressor 102 is an optical dispersive component that stretches laser pulses for amplification and compresses amplified stretched pulses to a desired temporal pulse-width prior to being directed to a workpiece by a beam delivery system. Pulse stretching has been previously demonstrated U.S. Pat. No. 5,960,016 issued to Perry et al.

Temporal stretching of the pulses from the laser source 101 by the stretcher-compressor 102 or for example by a chirped fiber Bragg grating acting as a pulse stretcher, decreases the peak power intensity of each individually stretched pulse because peak power is inversely proportional to the temporal duration of each individual pulse, (i.e., the longer in temporal pulse duration, the lower in peak power).

The embodiment shown in FIG. 10 uses the stretcher-compressor 102 to temporally stretch the individual short pulses, (e.g., 8 picoseconds) from the laser source 101 up to nanoseconds in time duration to prevent optical damage to components involved in the amplification process of the laser pulses. The stretched pulses are serially directed to the preamplifier 103 for first amplification from at least 50 picojoules of stretched pulse energy. The first amplified stretched pulses are directed to power amplifier 104 to second amplify the energy of each individually stretched pulse from about 0.5 millijoules to at least 25 millijoules. The stretched second amplified pulse output from the power amplifier 104 is then serially directed to the stretcher-compressor 102 to compress the individual pulses temporally (e.g., to picoseconds). Although the compression process from the stretcher-compressor 102 results in a slight loss of energy, (e.g., due to reflection losses, etc.), the amplification process is sufficient to produce at least 12.5 millijoules of output system energy to be directed by beam delivery system 105 to a workpiece (not shown) for material processing.

The preamplifier 103 and the power amplifier 104 of the embodiment illustrated in FIG. 10 can comprise multiple stages and preferably utilize Yb:YAG as the lasing material. Yb:YAG is the optimum choice among several suitable lasing materials because the material has the properties of low thermal loading, a long upper state storage time, a suitable wavelength of absorption to enable direct diode pumping and sufficient gain bandwidth to support the amplification with minimal spectral narrowing of the pulse.

However, any lasing material with sufficient spectral bandwidth, a long upper state storage lifetime, low thermal loading properties, and that can also be directly diode pumped may be used. Exemplary laser materials are Nd:doped glass, and Nd:doped yttrium lithium fluoride, Ti:Sapphire, Yb:YAG, Yb:glass, KGW, KYW, YLF, S-FAP, YALO, YCOB and GdCOB. The embodiment illustrated in FIG. 10 provides a short pulse laser system that uses end-pumped Yb:YAG amplifiers in a chirped pulse amplification architecture that operates between about 1022 and about 1088 nanometers, preferably between about 1029 and about 1031 nanometers, at high average power (e.g., between about 40 and about 100 watts).

The control system 106 can be positioned between each stage of the present invention as an active pointing and centering system to keep the system aligned, and can include a very stable platform and/or environmental controls. The control system 106 compensates for slow drifts due to thermal gradients. The output power is under active control and is monitored in beam delivery system 105 by a power meter and amplifier gain is adjusted using conventional optics (e.g., a waveplate and polarizer combination to attenuate and increase power levels). The beam delivery system 105 uses an opto-mechanical means to direct the high average power, short pulsed output of the embodiment illustrated in FIG. 10 to the workpiece (not shown).

In FIG. 10, the laser source 101 can be a commercial, 50 megahertz mode-locked fiber oscillator with Erbium (Er) as the laser material that operates with multiple longitudinal modes to generate ultra-short pulses. The laser source 101 provides a wavelength range between 1022 and 1088 nanometers, preferably 1029.7 nanometers. The laser source 101 has an average power output of at least 100 milliwatts, at least 2 nanojoules of energy, and a bandwidth up to 5 nanometers, preferably greater than about 2 nanometers. The temporal pulse-width is up to 8.1 picosecond (uncompressed), preferably about 800 femtoseconds (compressed), with an amplitude noise of not more that 5% RMS (i.e., Root Mean Square). The polarization extinction ratio is at least 100:1, with a TEM.sub.00 mode structure, and a beam divergence of at least 1.5 milliradians.

In the embodiment shown in FIG. 10, the output from the laser source 101 is directed to the stretcher-compressor 102. The pulses produced from these oscillators are very low in energy, (between about 0.1 nanojoules and about 2 nanojoules) and are stretched in time by a factor of five hundred or more prior to amplification.

Pulse stretching prior to amplification is necessary to avoid damaging the laser amplifiers by an intense pulse (e.g., femtosecond and picosecond laser pulses with sufficient energy). A dispersive optical device, as shown as the pulse stretcher-compressor 102 in FIG. 10, is a device in which the time required to traverse the device is a function of the frequency of the light. This is most commonly achieved by devices in which the optical path length is a function of frequency. Examples include propagation through a fiber or a chirped fiber Bragg grating, wherein the variation in optical path length with frequency, $\omega$, is given by the frequency dependence of the refractive index, $n(\omega)$, i.e., $L_{opt}=n(\omega)L_{fiber}$. Much higher dispersion can be achieved with pulse stretchers employing a diffraction grating wherein the different frequency components of the laser pulse travel physically different paths determined by the angular dispersion of the diffraction grating, $m\lambda=\sin(\theta_{in})+\sin(\theta_{out})$, where $\lambda$ is the wavelength of the laser light and $\theta_{in}$ and $\theta_{out}$ are the input and output angles from the diffraction grating, respectively.

The stretched pulse from the stretcher-compressor 102 is received and amplified by one or more orders of magnitude, with a preferred amplification of six orders of magnitude, (an order of magnitude being a multiplication of 10), to about a millijoule by the preamplifier 103 that receives each respective stretched pulse. Although several conventional types of laser preamplifiers may be used here, the preferred embodiment is a regenerative amplifier 103. In this device, multiple passes of the pulse can be made through a single amplifier lasing material. However, any type of preamplifier means operating within the parameters described above, such as for example a Yb:doped fiber amplifier using a large mode-area fiber, (preferably between about 25 and about 50 microns in diameter), constructed for short pulse laser applications can be employed in practice of the invention. This Yb:doped fiber amplifier would allow for a more compact geometry, because a single pass through such an amplifier would be capable of power amplification that is similar to the current regenerative amplifier, but with better stability.

Another example of a preamplifier 103 operating within design parameters is an optical parametric oscillator, (i.e., a nonlinear material capable of producing a coherent beam of light that can be tuned over a wide range of wavelengths) to obtain the required power levels. The repetition rate of the system when operating with a regenerative amplifier as the preamplifier 103 is determined by the optical switching within the regenerative amplifier. Switching of the pulse into and out of the regenerative amplifier is accomplished with optical pulse switching technology based on the Pöckels or acousto-optics effects.

In the embodiment illustrated in FIG. 10, pulses up to 0.75 millijoules in energy at 4 kilohertz (i.e., 3 W) are produced by the regenerative amplifier, which is utilized as a preamplifier 103. Following amplification from the regenerative amplifier, pulses are serially directed to a multi-pass amplifier such as a 4-pass power amplifier 104 having one or more Yb:YAG diode pumped solid state amplifiers collectively capable of generating up to 100 W. However, a two-pass power amplifier having one or more Yb:YAG diode pumped solid state amplifiers constructed to the design output parameters for the power amplifier 104 can also be employed. The power amplifier 104 usually uses at least two end-pumped heads with lens ducts and kW cw diode arrays (not shown). The embodiment illustrated in FIG. 10 extracts the required energy and beam quality in a manner that is different from similar directly diode pumped solid-state amplifiers. Similar prior art direct diode pumped systems build up the amplification from noise in an oscillator configuration. The embodiment illustrated in FIG. 10 directs a beam to be further amplified from the preamplifier 103 into a multi-pass amplifier 104 and after the required number of passes is completed, the beam has to be directed out of the multi-pass amplifier 104. This multi-pass amplifier 104 requires technical enhancement over similar prior art multi-pass amplifiers in extracting the energy and beam quality out of the system, because there is not a defined cavity mode as in an oscillator. Each amplifier, pumps for example, a 4×40 millimeter tapered Yb:YAG rod with about 800 W of pump radiation or more. The single-pass gain under normal operation (825 W pump) is about 1.9 for rods that are doped with about 0.55% Yb. Special water-cooled housings (not shown) for rods efficiently dissipate the heat generated from pumping and minimize Amplified Stimulated Emission (ASE) seeded parasitic losses. The power amplifier output optical plane is relayed by an up-collimating afocal telescope (not shown) to a system focusing lens (not shown), for a distance of about 16 to about 18 meters through the stretcher-compressor 102.

Prior to output to the system-focusing lens, output pulses from the 4-pass amplifier 104 are directed to stretcher-compressor 102 for compression of the stretched amplified pulses from the 4-pass amplifier 104 of the system. The compressing process incorporates a, highly efficient (i.e., greater than 90% diffraction efficiency), reflective diffraction multilayer dielectric grating. The stretcher-compressor 102 causes compression of an amplified stretched pulse from about 4 nanoseconds to about 2 picoseconds. This final temporal pulsewidth allows for a desired upper limit in order to achieve maximum penetration of the workpiece (not shown) within permissible time frames, (e.g., from about 0.1 second to about 60 seconds), with no heat-affected or slag zone.

The pulse stretcher-compressor 102 dielectric grating exhibits diffraction efficiency that is greater than 97% at a 1030 nanometer design wavelength. Consequently, the throughput of the four-pass grating compressor is at least 70%. The method of producing high peak power ultrashort pulses where the initial short pulse is stretched prior to amplification, amplified and then recompressed in a separate compressor not part of the stretcher, was published by D. Strickland and G. Mourou, *Compression of Amplified Chirped Optical Pulses*, Optics Communications, Vol. 56, No. 3, pgs. 219-221, December 1985 and M. D. Perry and G. Mourou, *Terawatt to Petawatt Subpicosecond Lasers*, Science, 264, 917 (1994).

The output from the stretcher-compressor 102 is directed to a workpiece held in an evacuated chamber (not shown) by a computer-controlled beam delivery system 105. The power output is computer controlled 106 with feedback loops to maintain from about 0.1 to about 20 Watts of average power, (i.e., for a 4 kilohertz repetition rate from the system, 12.5 millijoules of energy is needed for 20 Watts of average power).

The embodiment shown in FIG. 10 can produce a plurality of laser pulses with pulse durations from about 0.05 to less than about 10 picoseconds, with a bandwidth between about 1.5 nanometers and about 35 nanometers. Material processing experiments are performed, wherein the energy per pulse obtainable from the laser system is variable from 1 millijoule to about 12.5 millijoules (at repetition rates greater than 4 kilohertz) deliverable in a beam having a spot size variable to at least 0.016" in diameter. Thus, a focused fluence from about 0.1 to less than about 20 Joules/centimeter is readily achieved. Such may be effective in ablating any type of workpiece such as metals, alloys, ceramics, amorphous materials and crystals. Various target plane diagnostics such as near and far field cameras, temporal detectors, a power monitor, an autocorrelator and a spectrometer record the important parameters of the laser beam at the work piece. The focusing conditions must achieve the threshold fluence of at least 0.1 Joules/centimeter to achieve the optimum ablation conditions.

The foregoing description of embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

Thus, while only certain embodiments of the invention have been specifically described herein, it will be apparent that numerous modifications may be made thereto without departing from the spirit and scope of the invention. Further, acronyms are used merely to enhance the readability of the specification and claims. It should be noted that these acronyms are not intended to lessen the generality of the terms used and they should not be construed to restrict the scope of the claims to the embodiments described therein.

What is claimed is:

1. A laser apparatus, comprising:
    a laser pulse source comprising a mode-locked fiber laser;
    a first pulse stretcher configured for stretching said laser pulses to produce one or more stretched laser pulses;
    a fiber amplifier coupled between said laser pulse source and said first pulse stretcher;
    an amplifier configured to receive each of said stretched pulses to produce amplified stretched pulses, wherein said amplifier comprises at least a regenerative amplifier; and
    a pulse compressor configured for producing one or more compressed amplified laser pulses obtained from stretched amplified laser pulses;
    wherein a frequency shift in said fiber amplifier is used to tune said laser pulse source wavelength to said regenerative amplifier wavelength.

2. The laser apparatus of claim 1, wherein said fiber amplifier uses at least anomalous dispersion or a chirped pulse input to spectrally narrow said laser pulses output from said laser pulse source.

3. The laser apparatus of claim 1, wherein said fiber amplifier is a multimode fiber amplifier.

4. The laser apparatus according to 3, wherein the area of said multi-mode fiber amplifier is large enough to avoid spectral broadening.

5. The laser apparatus of claim 3, wherein said multimode fiber is a multimode photonic crystal fiber amplifier.

6. The laser apparatus of claim 1, wherein said fiber amplifier is pumped by a co-propagating pump laser and a counter-propagating pump laser to tune said laser pulse source wavelength to said regenerative amplifier wavelength.

7. The laser apparatus of claim 1, wherein said fiber amplifier comprises a Yb: or Nd: fiber amplifier that spectrally broadens said laser pulses output from said laser pulse source.

8. A laser apparatus, comprising:
    a laser pulse source comprising a mode-locked fiber laser;
    a first pulse stretcher configured for stretching said laser pulses to produce one or more stretched laser pulses;
    a fiber amplifier coupled between said laser pulse source and said first pulse stretcher;
    an amplifier configured to receive each of said stretched pulses to produce amplified stretched pulses, wherein said amplifier comprises at least a regenerative amplifier; and
    a pulse compressor configured for producing one or more compressed amplified laser pulses obtained from stretched amplified laser pulses;
    wherein a frequency shift in said fiber amplifier is used to spectrally narrow said laser pulses output from said laser pulse source.

9. A laser apparatus, as claimed in claim 1, further including
    a second pulse stretcher coupled to said laser pulse source; and
    said fiber amplifier being coupled to said second pulse stretcher and said first pulse stretcher.

10. A mode locked laser system for seeding a regenerative amplifier, comprising:
    a source of laser pulses;
    a Yb: fiber amplifier for amplifying said pulses;

and a regenerative amplifier based on Nd: or Yb: or Ti:Al$_2$O$_3$ materials for receiving said amplified pulses as seed pulses, wherein at least one of said pulse source or said Yb: fiber amplifier includes means for controlling a bandwidth and a spectral center of its output for spectral matching to said regenerative amplifier.

* * * * *